US009853043B2

(12) United States Patent
Lu et al.

(10) Patent No.: US 9,853,043 B2
(45) Date of Patent: Dec. 26, 2017

(54) METHOD OF MAKING A MULTILEVEL MEMORY STACK STRUCTURE USING A CAVITY CONTAINING A SACRIFICIAL FILL MATERIAL

(71) Applicant: SANDISK TECHNOLOGIES INC., Plano, TX (US)

(72) Inventors: Zhenyu Lu, Milpitas, CA (US); Daxin Mao, San Jose, CA (US); Tong Zhang, Palo Alto, CA (US); Johann Alsmeier, San Jose, CA (US); Wenguang Shi, Milpitas, CA (US); Henry Chien, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/834,830

(22) Filed: Aug. 25, 2015

(65) Prior Publication Data

US 2017/0062454 A1    Mar. 2, 2017

(51) Int. Cl.
*H01L 27/108* (2006.01)
*H01L 29/94* (2006.01)
(Continued)

(52) U.S. Cl.
CPC .. *H01L 27/11582* (2013.01); *H01L 21/32055* (2013.01); *H01L 21/32133* (2013.01);
(Continued)

(58) Field of Classification Search
CPC ........... H01L 23/5226; H01L 27/11551; H01L 29/4916; H01L 27/11578; H01L 29/66825; H01L 29/66833
(Continued)

(56) References Cited

U.S. PATENT DOCUMENTS

| 5,387,530 A | 2/1995 | Doyle et al. |
| 5,915,167 A | 6/1999 | Leedy |

(Continued)

FOREIGN PATENT DOCUMENTS

| EP | 1398831 A2 | 3/2004 |
| WO | WO02/15277 A2 | 2/2002 |

(Continued)

OTHER PUBLICATIONS

U.S. Appl. No. 14/748,808, filed Jun. 24, 2015, SanDisk Technologies Inc.

(Continued)

*Primary Examiner* — Olik Chaudhuri
*Assistant Examiner* — Wilner Jean Baptiste
(74) *Attorney, Agent, or Firm* — The Marbury Law Group PLLC

(57) ABSTRACT

A method of forming a three-dimensional memory device, includes forming a lower stack structure of insulating and first sacrificial material layers over a substrate, forming first memory openings through the lower stack structure and filling the first memory openings with a sacrificial fill material, replacing the first sacrificial material layers with first electrically conductive layers, forming an upper stack structure of insulating and second sacrificial material layers over the lower stack structure after replacing the first sacrificial material layers, forming second memory openings through the upper stack structure in areas overlying the first memory openings, replacing the second sacrificial material layers with second electrically conductive layers, removing the sacrificial fill material from the first memory openings underneath the second memory openings to form inter-stack memory openings after replacing the second sacrificial material layers, and forming memory stack structures within the inter-stack memory openings.

17 Claims, 25 Drawing Sheets

(51) Int. Cl.

| | |
|---|---|
| *H01L 27/11582* | (2017.01) |
| *H01L 23/528* | (2006.01) |
| *H01L 23/522* | (2006.01) |
| *H01L 21/3205* | (2006.01) |
| *H01L 21/3213* | (2006.01) |
| *H01L 21/768* | (2006.01) |
| *H01L 29/792* | (2006.01) |
| *H01L 27/11575* | (2017.01) |
| *H01L 27/11556* | (2017.01) |
| *H01L 29/788* | (2006.01) |
| *H01L 27/11548* | (2017.01) |

(52) U.S. Cl.
CPC .. *H01L 21/76802* (2013.01); *H01L 21/76877* (2013.01); *H01L 23/528* (2013.01); *H01L 23/5226* (2013.01); *H01L 27/11575* (2013.01); *H01L 29/7926* (2013.01); *H01L 27/11548* (2013.01); *H01L 27/11556* (2013.01); *H01L 29/7889* (2013.01)

(58) Field of Classification Search
USPC .......................................................... 257/314
See application file for complete search history.

(56) References Cited

U.S. PATENT DOCUMENTS

| | | | |
|---|---|---|---|
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,745,265 | B2 | 6/2010 | Mokhlesi et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,349,681 | B2 | 1/2013 | Alsmeier et al. |
| 8,394,716 | B2 | 3/2013 | Hwang et al. |
| 8,445,347 | B2 | 5/2013 | Alsmeier |
| 8,450,181 | B2 | 5/2013 | Chen et al. |
| 8,614,126 | B1 | 12/2013 | Lee et al. |
| 8,658,499 | B2 | 2/2014 | Makala et al. |
| 8,741,761 | B2 | 6/2014 | Lee et al. |
| 8,847,302 | B2 | 9/2014 | Alsmeier et al. |
| 8,878,278 | B2 | 11/2014 | Alsmeier et al. |
| 8,884,357 | B2 | 11/2014 | Wang et al. |
| 8,946,023 | B2 | 2/2015 | Makala et al. |
| 2006/0003531 | A1 | 1/2006 | Chang et al. |
| 2006/0258076 | A1 | 11/2006 | Mizushima et al. |
| 2007/0210338 | A1 | 9/2007 | Orlowski |
| 2007/0252201 | A1 | 11/2007 | Kito et al. |
| 2008/0067583 | A1 | 3/2008 | Kidoh et al. |
| 2008/0169496 | A1 | 7/2008 | Keller et al. |
| 2009/0026561 | A1 | 1/2009 | Reichenbach et al. |
| 2009/0121271 | A1 | 5/2009 | Son et al. |
| 2009/0242967 | A1 | 10/2009 | Katsumata et al. |
| 2010/0044778 | A1 | 2/2010 | Seol |
| 2010/0059811 | A1 | 3/2010 | Sekine et al. |
| 2010/0109065 | A1 | 5/2010 | Oh et al. |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0171162 | A1 | 7/2010 | Katsumata et al. |
| 2010/0181610 | A1 | 7/2010 | Kim et al. |
| 2010/0207195 | A1 | 8/2010 | Fukuzumi et al. |
| 2010/0213458 | A1 | 8/2010 | Prall |
| 2010/0320528 | A1 | 12/2010 | Jeong et al. |
| 2011/0065270 | A1 | 3/2011 | Shim et al. |
| 2011/0076819 | A1 | 3/2011 | Kim et al. |
| 2011/0090737 | A1* | 4/2011 | Yoo .................... G11C 16/0483 365/185.11 |
| 2011/0133606 | A1 | 6/2011 | Yoshida et al. |
| 2011/0151667 | A1* | 6/2011 | Hwang ............. H01L 27/11551 438/667 |
| 2011/0233646 | A1 | 9/2011 | Mizushima et al. |
| 2011/0266606 | A1 | 11/2011 | Park et al. |
| 2011/0287612 | A1 | 11/2011 | Lee et al. |
| 2011/0312174 | A1 | 12/2011 | Lee et al. |
| 2012/0001247 | A1 | 1/2012 | Alsmeier |
| 2012/0001249 | A1 | 1/2012 | Alsmeier et al. |
| 2012/0003800 | A1 | 1/2012 | Lee et al. |
| 2012/0052674 | A1 | 3/2012 | Lee et al. |
| 2012/0068242 | A1 | 3/2012 | Shin et al. |
| 2012/0074367 | A1 | 3/2012 | Costa et al. |
| 2012/0140562 | A1 | 6/2012 | Choe et al. |
| 2012/0153372 | A1* | 6/2012 | Kim .................. H01L 27/11556 257/314 |
| 2012/0153376 | A1 | 6/2012 | Alsmeier et al. |
| 2012/0208347 | A1 | 8/2012 | Hwang et al. |
| 2012/0256247 | A1 | 10/2012 | Alsmeier et al. |
| 2012/0261638 | A1 | 10/2012 | Sills et al. |
| 2012/0276719 | A1* | 11/2012 | Han .................... H01L 29/7926 438/478 |
| 2013/0248974 | A1 | 9/2013 | Alsmeier et al. |
| 2013/0264631 | A1 | 10/2013 | Alsmeier et al. |
| 2013/0313627 | A1 | 11/2013 | Lee et al. |
| 2013/0313717 | A1 | 11/2013 | Holmes et al. |
| 2013/0322174 | A1 | 12/2013 | Li et al. |
| 2014/0264525 | A1 | 9/2014 | Takahashi et al. |
| 2014/0264533 | A1 | 9/2014 | Simsek-Ege et al. |
| 2014/0264542 | A1 | 9/2014 | Simsek-Ege et al. |
| 2014/0273373 | A1 | 9/2014 | Makala et al. |
| 2017/0117294 | A1* | 4/2017 | Lee .................... H01L 27/11582 |
| 2017/0148816 | A1* | 5/2017 | Sasaki ............... H01L 27/11582 |

FOREIGN PATENT DOCUMENTS

| | | |
|---|---|---|
| WO | WO2008/118433 A1 | 10/2008 |
| WO | WO2009/085078 A1 | 7/2009 |
| WO | WO2012/003301 A2 | 1/2012 |
| WO | WO2015/126664 A1 | 8/2015 |

OTHER PUBLICATIONS

U.S. Appl. No. 14/834,943, filed Aug. 25, 2015, SanDisk Technologies Inc.
Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Maeda et al., "Multi-Stacked 1G Cell/Layer Pipe-Shaped BiCS Flash Memory," 2009 Symposium on VLSI Technology Digest of Technical Papers, pp. 22-23.
Endoh et al., "Novel Ultra High Density Memory with a Stacked-Surrounding Gate Transistor (S-SGT) Structured Cell," IEDM Proc. (2001) 33-36.
Tanaka et al., "Bit-Cost Scalable Technology for Low-Cost and Ultrahigh-Density Flash Memory," Toshiba Review, vol. 63, No. 2, 2008, pp. 28-31.
Kimura, M. "3D Cells Make Terabit NAND Flash Possible," Nikkei Electronics Asia, Sep. 17, 2009, 6pgs.
International Search Report & Written Opinion, PCT/US2011/042566, dated Jan. 17, 2012.
Invitation to Pay Additional Fees & Partial International Search Report, PCT/US2011/042566, dated Sep. 28, 2011.
Jang et al., "Memory Properties of Nickel Silicide Nanocrystal Layer for Possible Application to Nonvolatile Memory Devices," IEEE Transactions on Electron Devices, vol. 56, No. 12, Dec. 2009.

(56) References Cited

OTHER PUBLICATIONS

Chen et al., "Reliability Characteristics of NiSi Nanocrystals Embedded in Oxide and Nitride Layers for Nonvolatile Memory Application," Applied Physics Letters 92, 152114 (2008).
J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.
Li, W. et al., "Sacrificial Polymers for Nanofluidic Channels in Biological Applications", Nanotechnology 14 (2003) 578-583.
Invitation to Pay Additional Search Fees, International Application No. PCT/US13/24638, dated Apr. 24, 2013.
Non-Final Office for U.S. Appl. No. 13/933,743, Office Action dated Apr. 21, 2014, 29pgs.
Search Report and Written Opinion PCT/US2014/020290, dated Jun. 25, 2014, 10 pages.
Search Report and Written Opinion of PCT/US2014/023276, dated Jun. 30, 2014, 13 pages.
Invitation to Pay Additional Fees and Annex Partial International Search Report for PCT/US2015/015155, dated May 25, 2015, 8 Sheets.
Office Action dated Apr. 21, 2014, for U.S. Appl. No. 13/933,743, (29 pages).
U.S. Appl. No. 14/133,979, filed Dec. 19, 2013, SanDisk Technologies Inc.
U.S. Appl. No. 14/225,116, filed Mar. 25, 2014, SanDisk Technologies Inc.
U.S. Appl. No. 14/225,176, filed Mar. 25, 2014, SanDisk Technologies Inc.
U.S. Appl. No. 14/317,274, filed Jun. 27, 2014, SanDisk Technologies Inc.
U.S. Appl. No. 14/517,134, filed Oct. 17, 2014, SanDisk Technologies Inc.
U.S. Appl. No. 14/611,785, filed Feb. 2, 2015, SanDisk Technologies Inc.
U.S. Appl. No. 62/154,916, filed Apr. 30, 2015, SanDisk Technologies Inc.
Invitation to Pay Additional Fees and Communication Relating to the Results of the Partial International Search from the International Searching Authority for International Application No. PCT/US2016/036837, dated Oct. 11, 2016, 11 pages.
International Search Report and Written Opinion of the International Searching Authority for International Application No. PCT/US2016/036837, dated Dec. 1, 2016, 24 pages.

\* cited by examiner

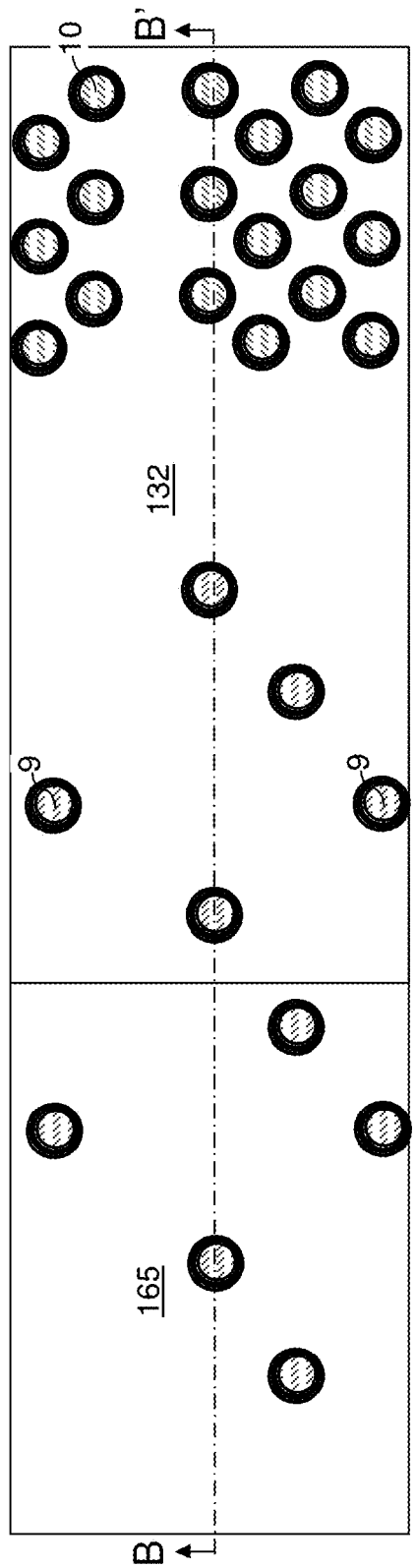
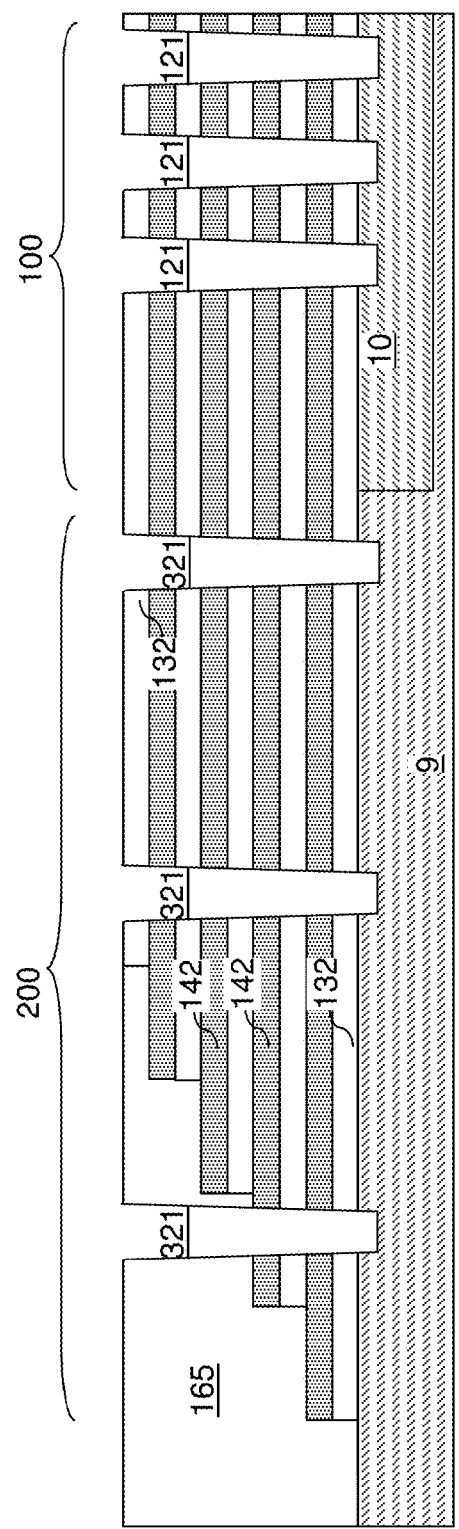
FIG. 3A
FIG. 3B

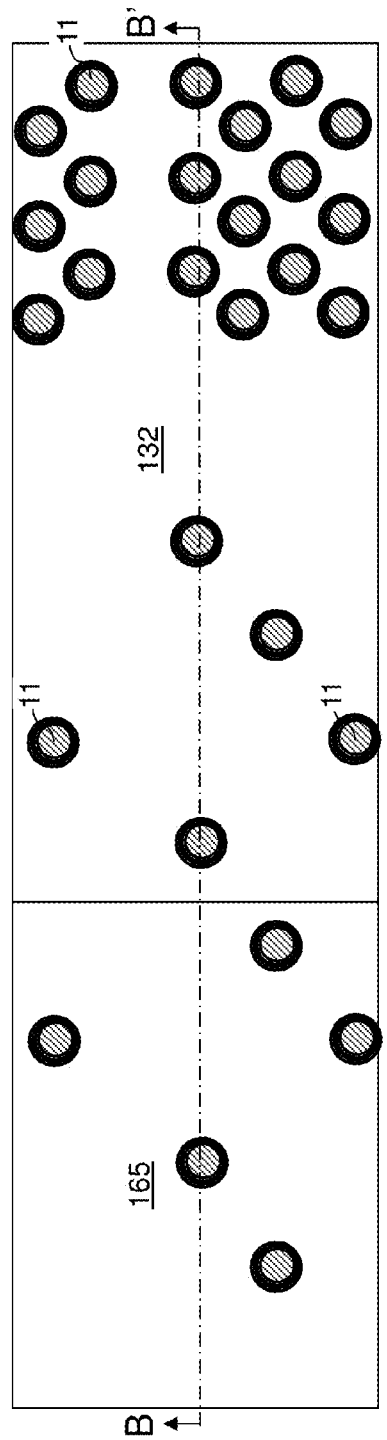
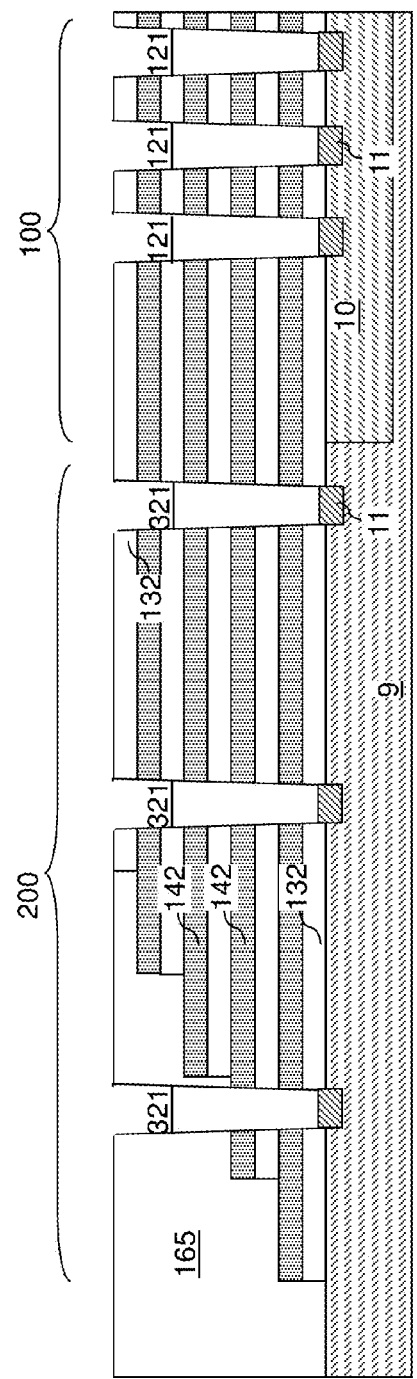
FIG. 4A
FIG. 4B

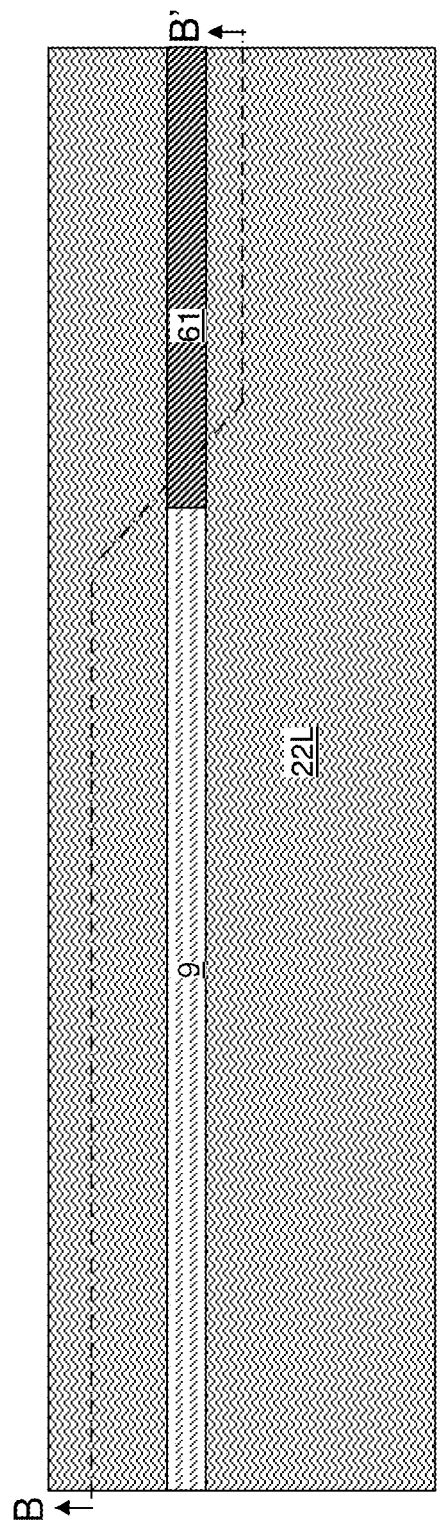
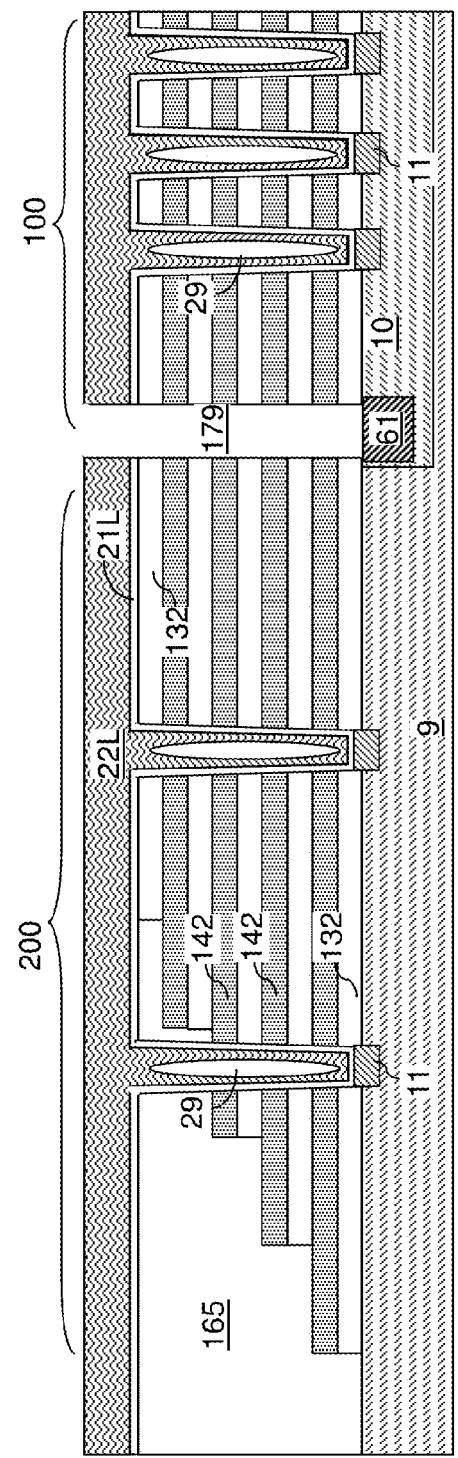
FIG. 7A
FIG. 7B

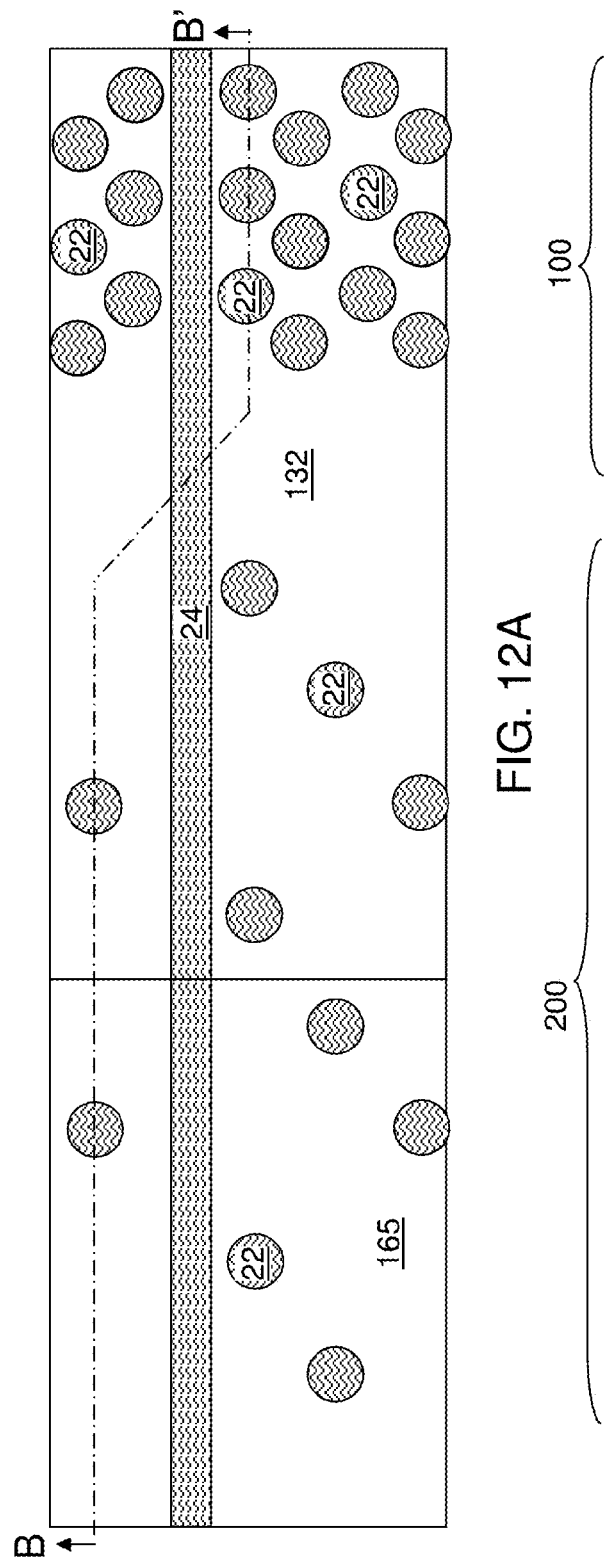
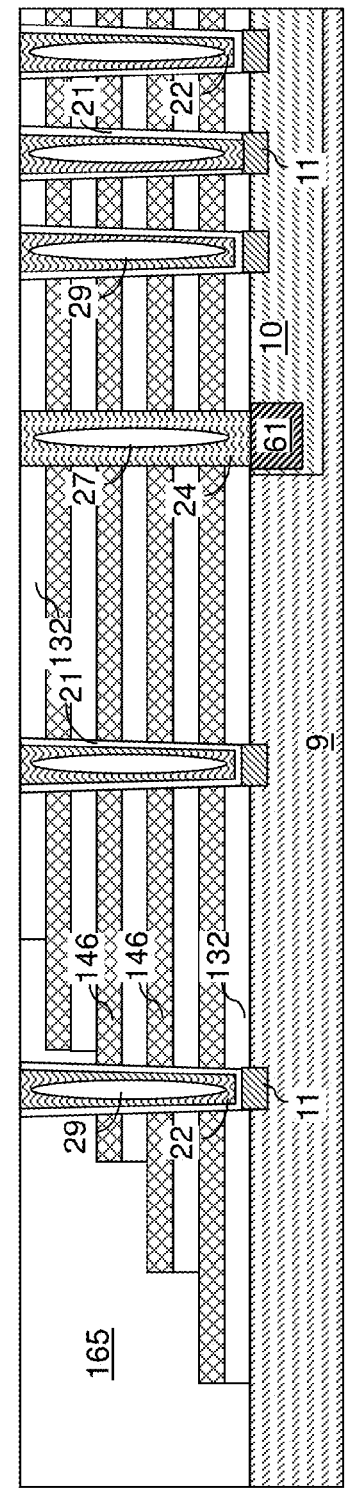
FIG. 12A
FIG. 12B

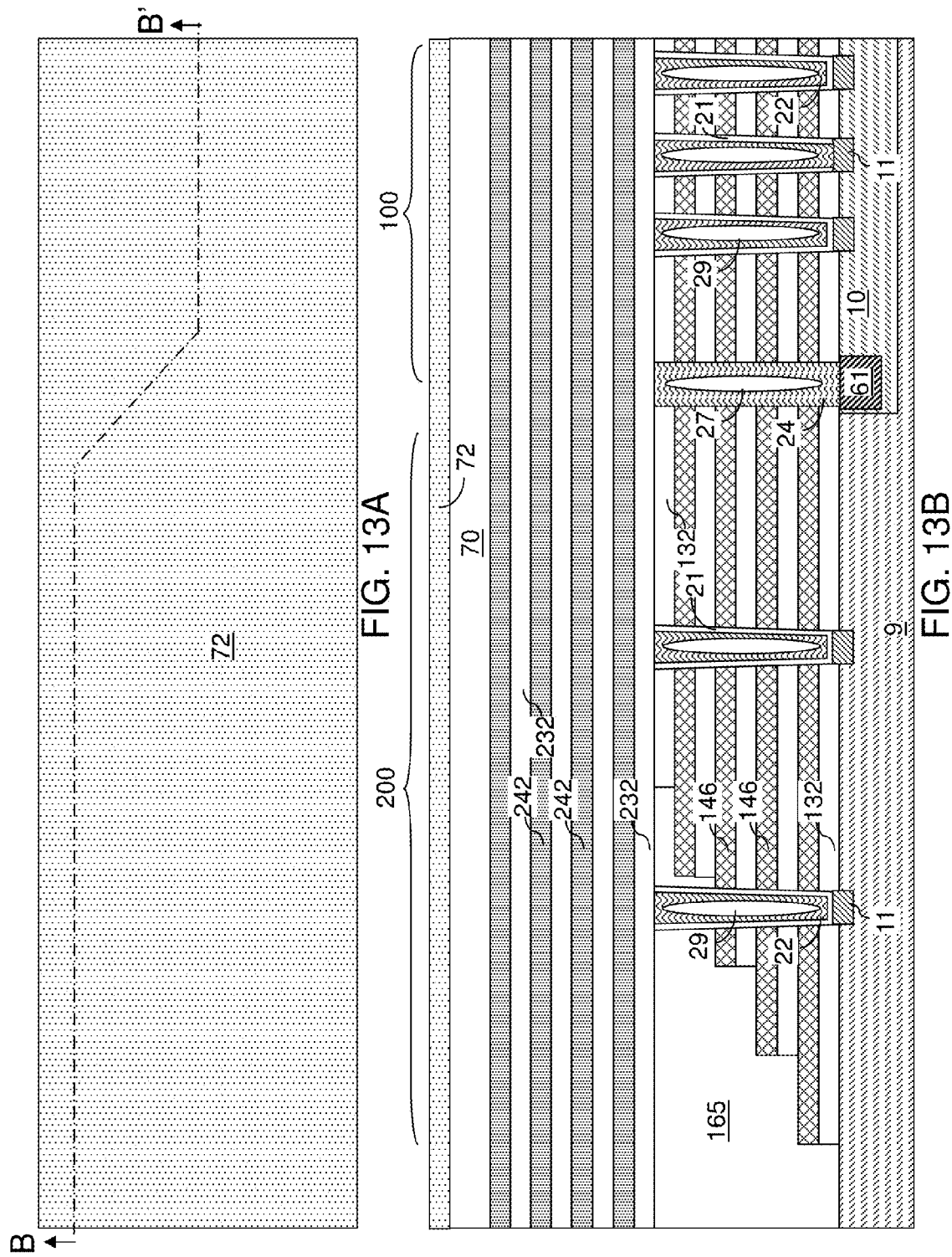

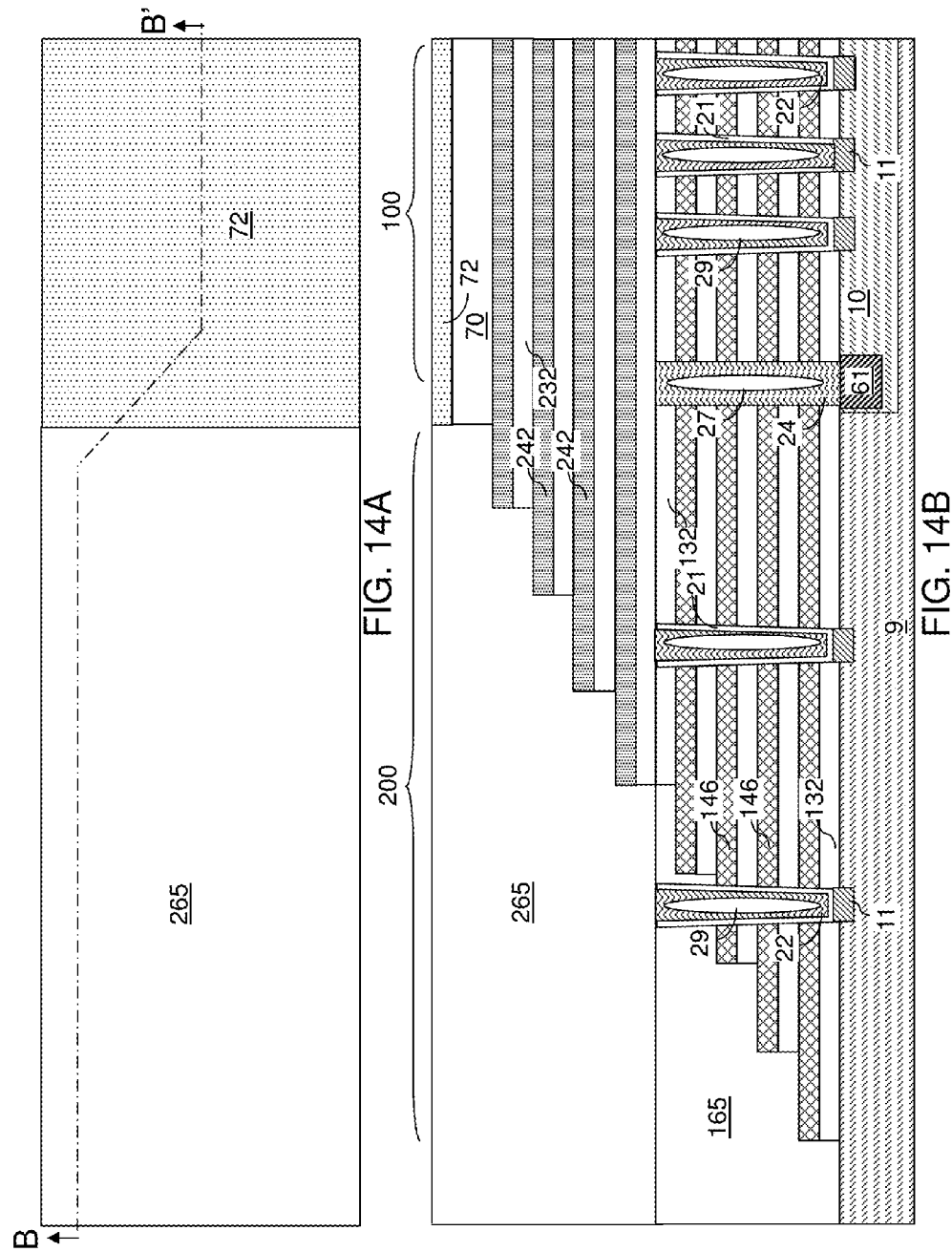

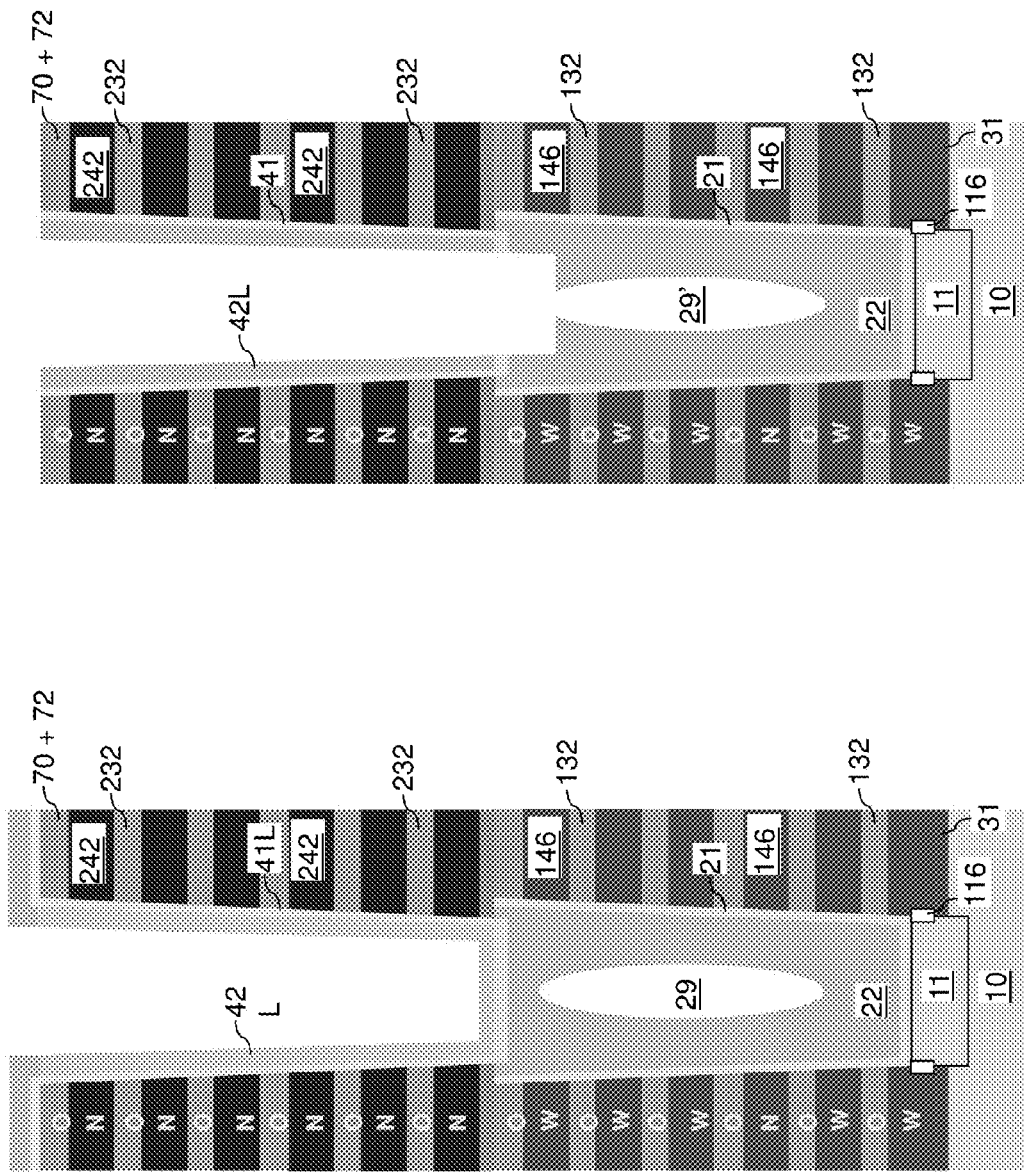

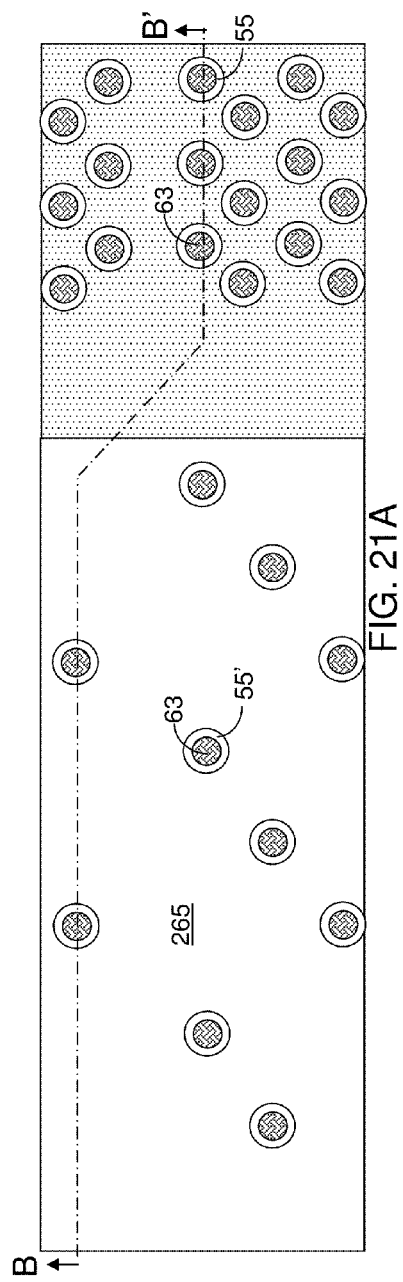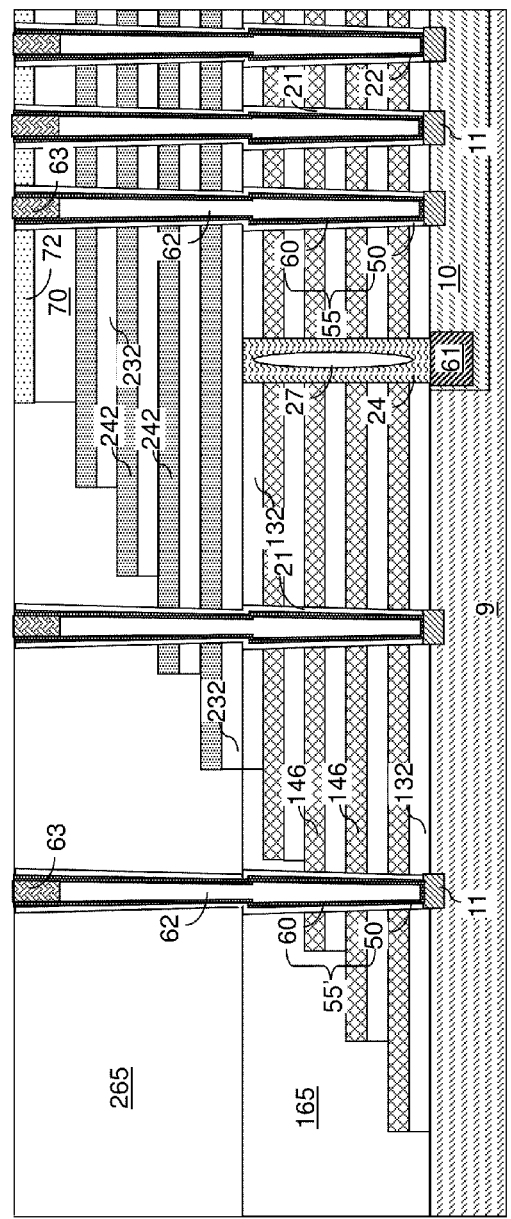
FIG. 21A
FIG. 21B

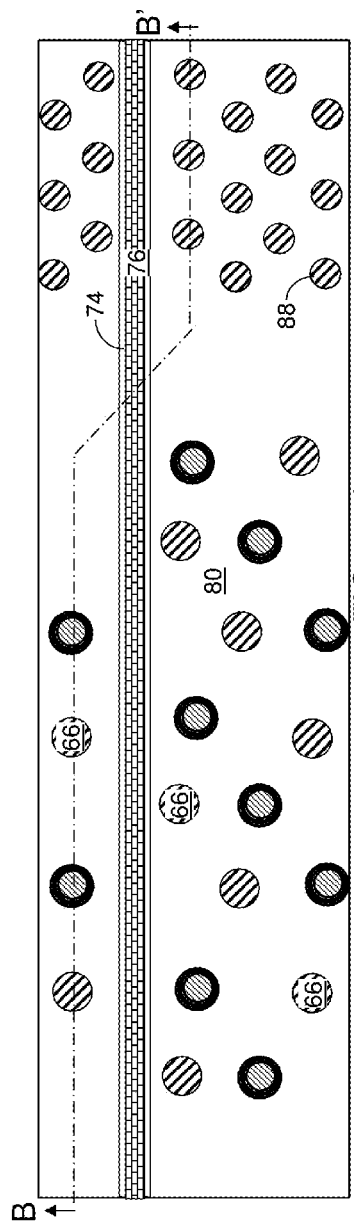
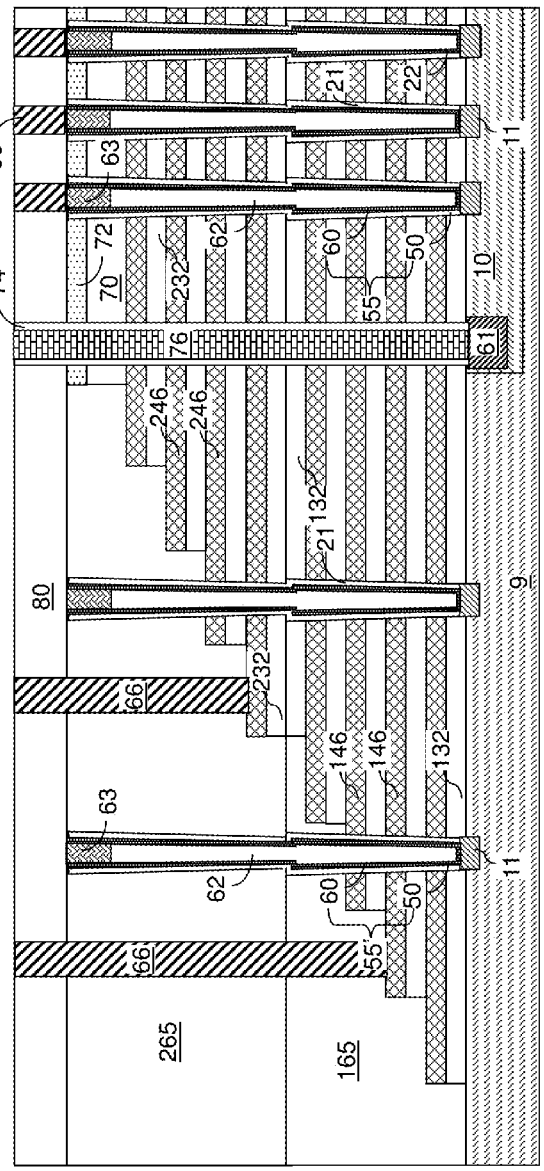
FIG. 26A
FIG. 26B

METHOD OF MAKING A MULTILEVEL MEMORY STACK STRUCTURE USING A CAVITY CONTAINING A SACRIFICIAL FILL MATERIAL

FIELD

The present disclosure relates generally to the field of three-dimensional memory devices and specifically to three-dimensional memory devices including a vertical stack of multilevel memory arrays and methods of making the same.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional memory device comprises a lower stack structure comprising a first alternating stack including first insulating layers and first electrically conductive layers and located over a substrate, an upper stack structure comprising a second alternating stack including second insulating layers and second electrically conductive layers and located over the lower stack structure, and a plurality of memory stack structures extending through the lower stack structure and the upper stack structure. Each of the memory stack structures is located in a memory opening and comprises a lower blocking dielectric contacting a sidewall of a lower portion of the memory opening, and an upper blocking dielectric contacting a sidewall of an upper portion of the memory opening and not in physical contact with the lower blocking dielectric. The sidewall of the lower portion of the memory opening is adjoined to the sidewall of the upper portion of the memory opening by a horizontal bottom surface of the upper stack structure. Each of the plurality of memory stack structures comprises a memory film including a memory material layer and a tunneling dielectric layer, and each memory material layer contacts the horizontal bottom surface of the upper stack structure.

According to another aspect of the present disclosure, a method of forming a three-dimensional memory device includes forming a lower stack structure of insulating and first sacrificial material layers over a substrate, forming first memory openings through the lower stack structure and filling the first memory openings with a sacrificial fill material, replacing the first sacrificial material layers with first electrically conductive layers, forming an upper stack structure of insulating and second sacrificial material layers over the lower stack structure after replacing the first sacrificial material layers, forming second memory openings through the upper stack structure in areas overlying the first memory openings, replacing the second sacrificial material layers with second electrically conductive layers, removing the sacrificial fill material from the first memory openings underneath the second memory openings to form inter-stack memory openings after replacing the second sacrificial material layers, and forming memory stack structures within the inter-stack memory openings.

BRIEF DESCRIPTION OF THE DRAWINGS

FIG. 3A is a top-down view of the exemplary structure after formation of first memory openings in a device region and first support openings in a contact region according to an embodiment of the present disclosure.

FIG. 3B is a vertical cross-sectional view of the exemplary structure of FIG. 3A along the vertical plane B-B'.

FIG. 4A is a top-down view of the exemplary structure after formation of epitaxial channel portions at a bottom of each first memory opening and each first support opening according to an embodiment of the present disclosure.

FIG. 4B is a vertical cross-sectional view of the exemplary structure of FIG. 4A along the vertical plane B-B'.

FIG. 7A is a top-down view of the exemplary structure after formation of a lower level contact trench according to an embodiment of the present disclosure.

FIG. 7B is a vertical cross-sectional view of the exemplary structure of FIG. 7A along the vertical plane B-B'.

FIG. 12A is a top-down view of the exemplary structure after planarizing the first and second sacrificial fill material layers according to an embodiment of the present disclosure.

FIG. 12B is a vertical cross-sectional view of the exemplary structure of FIG. 12A along the vertical plane B-B'.

FIG. 13A is a top-down view of the exemplary structure after formation of a second alternating stack of second insulating layers and second sacrificial material layers according to an embodiment of the present disclosure.

FIG. 13B is a vertical cross-sectional view of the exemplary structure of FIG. 13A along the vertical plane B-B'.

FIG. 14A is a top-down view of the exemplary structure after formation of second stepped surfaces and a second retro-stepped dielectric material portion according to an embodiment of the present disclosure.

FIG. 14B is a vertical cross-sectional view of the exemplary structure of FIG. 14A along the vertical plane B-B'.

FIG. 16 is a vertical cross-sectional view of a stack of a first memory opening and a second memory opening after deposition of a second blocking dielectric layer and a sacrificial liner according to an embodiment of the present disclosure.

FIG. 17 is a vertical cross-sectional view of the stack of the first and second memory openings after an anisotropic etch that removes an upper cap portion of an encapsulated cavity according to an embodiment of the present disclosure.

FIG. 21A is a top-down view of the exemplary structure after formation of memory stack structures, dummy memory stack structures, dielectric cores, and drain regions according to an embodiment of the present disclosure.

FIG. 21B is a vertical cross-sectional view of the exemplary structure of FIG. 21A along the vertical plane B-B'.

FIG. 26A is a top-down view of the exemplary structure after formation of an insulating spacer and a backside contact via structure according to an embodiment of the present disclosure.

FIG. 26B is a vertical cross-sectional view of the exemplary structure of FIG. 26A along the vertical plane B-B'.

DETAILED DESCRIPTION

Figure 1:
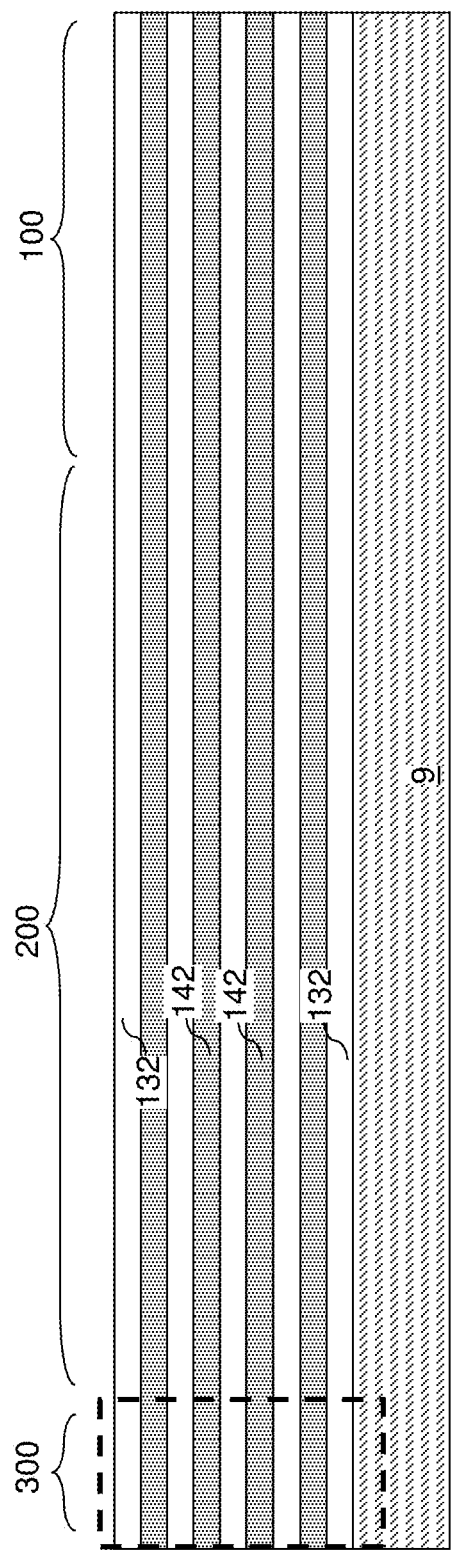
FIG. 1 is a vertical cross-sectional view of an exemplary structure after formation of a first alternating stack of first insulating layers and first sacrificial material layers according to an embodiment of the present disclosure.

As discussed above, the present disclosure is directed to three-dimensional memory devices including a vertical stack of multilevel memory arrays and methods of making the same, the various aspects of which are described below. An embodiment of the disclosure can be employed to form semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous contiguous structure that has a thickness less than the thickness of the contiguous structure. For example, a layer may be located between any pair of horizontal planes between, or at, a top surface and a bottom surface of the contiguous structure. A layer may extend horizontally, vertically, and/or along a tapered surface. A substrate may be a layer, may include one or more layers therein, and/or may have one or more layer thereupon, thereabove, and/or therebelow.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate semiconductor layer 9 can comprise a single crystalline semiconductor material, such as a single crystal silicon wafer.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valance band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

The exemplary structure includes a device region 100, in which memory devices can be subsequently formed, and a contact region 200, in which stepped surfaces are subsequently formed. As used herein, a "contact region" refers to a region in which contact via structures are to be formed. At least one semiconductor device for a peripheral circuitry can be formed in a peripheral device region 300, of which the general location is illustrated by a dotted rectangle (detailed structures not shown for clarity). The at least one semiconductor device can include, for example, one or more field effect transistors. The least one semiconductor device for the peripheral circuitry can contain a driver circuit for memory devices to be subsequently formed, which can include at least one NAND device.

Optionally, a semiconductor material layer 10 can be provided in an upper portion of the substrate. The semiconductor material layer 10 can be formed, for example, by implantation of electrical dopants (p-type dopants or n-type dopants) into an upper portion of the substrate semiconductor layer 9, or by deposition of a single crystalline semiconductor material, for example, by selective epitaxy. In one embodiment, the semiconductor material layer 10 can include a single crystalline semiconductor material (e.g., p-well) that is in epitaxial alignment with the single crystalline structure of the substrate semiconductor layer 9.

An alternating stack of first material layers and second material layers is subsequently formed. Each first material layer can include a first material, and each second material layer can include a second material that is different from the first material. In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. The alternating stack formed by the first insulating layers 132 and the first sacrificial material layers 142 is herein referred to as a first alternating stack (132, 142), or a lower alternating stack (132, 142). In this case, the stack can include an alternating plurality of first insulating layers 132 and first sacrificial material layers 142. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the first sacrificial material layers 142 can be material layers that comprise silicon nitride or a semiconductor material including at least one of silicon and germanium.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first alternating stack (132, 142) can have a uniform thickness that is substantially invariant within each respective first sacrificial material layer 142.

Figure 2:
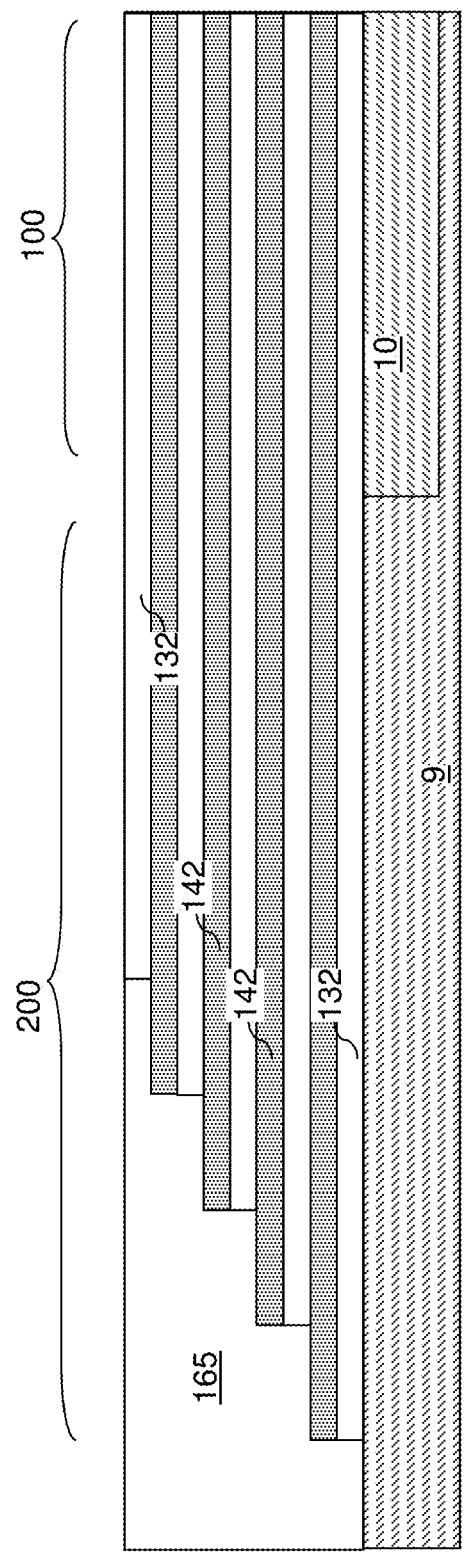
FIG. 2 is a vertical cross-sectional view of the exemplary structure after formation of first stepped surfaces and a first retro-stepped dielectric material portion according to an embodiment of the present disclosure.

Referring to FIG. 2, the lower stack structure (132, 142) can be patterned to form first stepped surfaces. The first stepped surfaces are formed in the contact region 200. The contact region 200 includes a first stepped area in which the first stepped surfaces are formed, and a second stepped area in which additional stepped surfaces are to be subsequently formed in an upper stack structure (to be subsequently formed over the lower stack structure). The device region 100 is provided adjacent to the contact region 200. Memory devices including memory stack structures can be subsequently formed in the device region 100. The first stepped surfaces can be formed, for example, by forming a mask layer with an opening therein, etching a cavity within the levels of the topmost first sacrificial material layer 142 and the topmost first insulating layer 132, and iteratively expanding the etched area and vertically recessing the cavity by etching each pair of a first insulating layer 132 and a first sacrificial material layer 142 located directly underneath the bottom surface of the etched cavity within the etched area. The first alternating stack (132, 142) is patterned such that each underlying first sacrificial material layer 142 laterally protrudes farther than any overlying first sacrificial material layer 142 in the etched region, and each underlying first insulating layer 132 laterally protrudes farther than any overlying first insulating layer 132 in the etched region. The contact region can be a contact region of the first alternating stack (132, 142). The cavity is herein referred to as a first stepped cavity.

A dielectric material is deposited to fill the first stepped cavity. Excess portions of the dielectric material overlying the topmost surface of the first alternating stack (132, 142), are removed for example, by chemical mechanical planarization. The remaining portion of the deposited dielectric material forms a first retro-stepped dielectric material portion 165, which is formed on the first stepped surfaces. The first dielectric material portion 165 is retro-stepped. As used herein, a "retro-stepped" element refers to an element that has stepped surfaces and a horizontal cross-sectional area that increases monotonically as a function of a vertical distance from a top surface of a substrate on which the element is present. The lower stack structure, which is also referred to as a first stack structure, comprises the first alternating stack (132, 142) and the first retro-stepped dielectric material portion 165.

Referring to FIGS. 3A and 3B, first openings (121, 321) extending to a top surface of the substrate (9, 10) are formed through the lower stack structure (132, 142, 165). The first openings (121, 321) include first memory openings 121 that are formed in the device region 100 and first support openings 321 that are formed in the contact region 200. For example, a lithographic material stack (not shown) including at least a photoresist layer can be formed over the lower stack structure (132, 142, 165), and can be lithographically patterned to form openings within the lithographic material stack. The pattern in the lithographic material stack can be transferred through the entirety of the lower stack structure (132, 142, 165) by at least one anisotropic etch that employs the patterned lithographic material stack as an etch mask. Portions of the lower stack structure (132, 142, 165) underlying the openings in the patterned lithographic material stack are etched to form the first openings (121, 321). In other words, the transfer of the pattern in the patterned lithographic material stack through the lower stack structure (132, 142, 165) forms the first openings (121, 321).

In one embodiment, the chemistry of the anisotropic etch process employed to etch through the materials of the first alternating stack (132, 142) can alternate to optimize etching of the first and second materials in the first alternating stack (132, 142) while providing a comparable average etch rate for the first dielectric material portion 165. The anisotropic etch can be, for example, a series of reactive ion etches. The sidewalls of the first openings (121, 321) can be substantially vertical, or can be tapered. Subsequently, the patterned lithographic material stack can be subsequently removed, for example, by ashing.

Optionally, the top layer 132 in the stack may function as an etch stop dielectric layer during subsequent steps. Thus, the top layer 132 in the stack may comprise a different material (e.g., metal oxide dielectric) from the remaining layers 132 (e.g., silicon oxide) in the stack. The first support opening 321 are formed through the first stack of alternating layers (132, 142) and through one of the first dielectric material portion 165 and the optional etch stop dielectric layer concurrently with formation of the first memory openings 121, which are formed through the etch stop dielectric layer and the first stack of alternating layers (132, 142). In one embodiment, the substrate (9, 10) can be employed as a stopping layer for the anisotropic etch process. In one embodiment, the first openings (121, 321) may extend below the top surface of the substrate (9, 10) by an overetch. The lateral dimensions (e.g., a diameter) of the first openings (121, 321) can be from about 20 nm to 200 nm at an upper portion of each first opening (121, 321), and can be about 10 nm to 150 nm at a lower portion of each first opening (121, 321). In one embodiment, the first memory openings 121 can be formed as an array of openings, which can be a periodic two-dimensional array of openings. The first support openings 321 can be formed as discrete openings that are mutually separated from one another, and may not form a periodic two-dimensional array pattern. The nearest neighbor lateral separation distance among the first support openings 321 may be greater than twice (e.g., three times or more) than the nearest neighbor distance among the first memory openings 121.

Referring to FIGS. 4A and 4B, an optional epitaxial channel portions 11 can be formed by a selective epitaxy process. The epitaxial channel portions 11 comprise a single crystalline semiconductor material in epitaxial alignment with the single crystalline substrate semiconductor material of the semiconductor material layer 10. Optionally, the epitaxial channel portions 11 can be doped with electrical dopants of a suitable conductivity type. In one embodiment, the semiconductor material layer 10 and the epitaxial channel portions 11 can have a doping of the first conductivity type (e.g., p-type).

The selective epitaxy process that forms the epitaxial channel portions 11 can be performed, for example, by sequentially or simultaneously flowing a reactant gas (such as $SiH_4$, $SiH_2Cl_2$, $SiHCl_3$, $SiCl_4$, $Si_2H_6$, $GeH_4$, $Ge_2H_6$, other semiconductor precursor gases, or combinations there) with an etchant gas (such as HCl). The deposition rate of the semiconductor material on amorphous surfaces (such as the surfaces of dielectric materials) is less than the etch rate of the semiconductor material by the etchant, while the deposition rate of the semiconductor material on crystalline surfaces (such as the top surface of the semiconductor material layer 10) is greater than the etch rate of the semiconductor material by the etchant. Thus, the semiconductor material is deposited only on the semiconductor surface, which is the physically exposed portion of the top surface of the semiconductor material layer 10. The process conditions (such as the deposition temperature, the partial pressure of the various gases in a process chamber, etc.) can be selected such that the deposited semiconductor material is epitaxial, i.e., single crystalline silicon or another semiconductor material with atomic alignment with the single crystalline structure of the semiconductor material layer 10 (e.g., p-well).

Figure 5A:
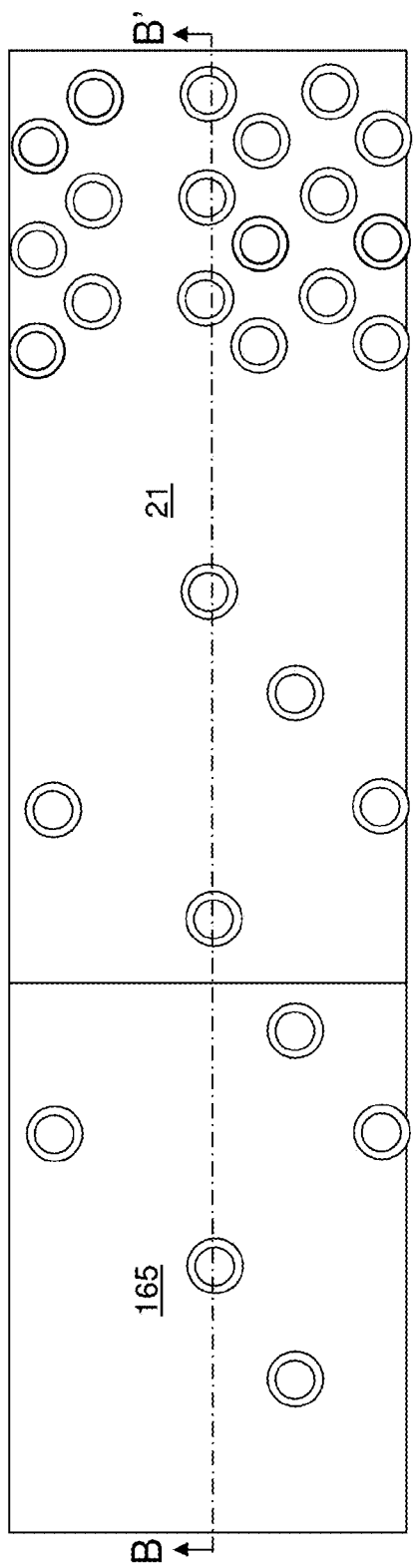
FIG. 5A is a top-down view of the exemplary structure after formation of a lower blocking dielectric layer according to an embodiment of the present disclosure.
Figure 5B:
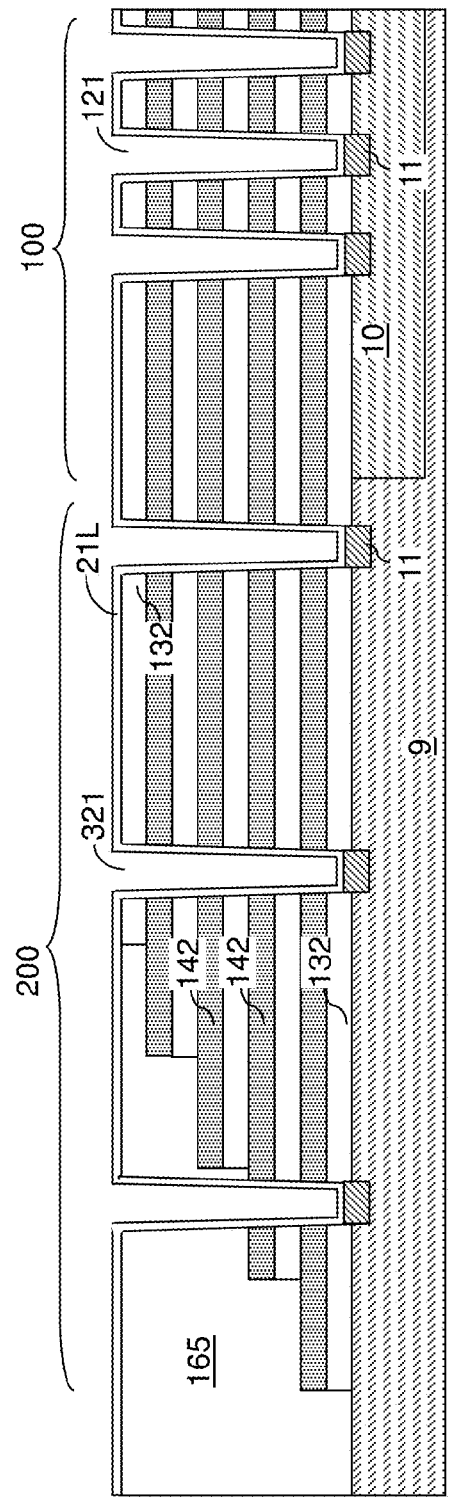
FIG. 5B is a vertical cross-sectional view of the exemplary structure of FIG. 5A along the vertical plane B-B'.

Referring to FIGS. 5A and 5B, a lower blocking dielectric layer 21L can be formed on the physically exposed surface of the first memory openings 121 and the first support openings 321 and over the first alternating stack (132, 142). The lower blocking dielectric layer 21L can include a single dielectric material layer or a plurality of dielectric material layers. The lower blocking dielectric layer 21L can be deposited on the sidewalls of each memory opening 121 by a conformal deposition method. In one embodiment, the lower blocking dielectric layer 21L can include a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the lower blocking dielectric layer 21L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The lower blocking dielectric layer 21L can be deposited, for example, by chemical vapor deposition (CVD), atomic layer deposition (ALD), pulsed laser deposition (PLD), liquid source misted chemical deposition, or a combination thereof. The thickness of the lower blocking dielectric layer 21L can be in a range from 1 nm to 20 nm, although lesser and greater thicknesses can also be employed. The lower blocking dielectric layer 21L can subsequently function as a dielectric material portion that blocks leakage of stored electrical charges to control gate electrodes. In one embodiment, the lower blocking dielectric layer 21L includes aluminum oxide.

Additionally or alternatively, the lower blocking dielectric layer 21L can include a silicon-based dielectric material such as silicon oxide, silicon oxynitride, silicon nitride, or a combination thereof. In one embodiment, the lower blocking dielectric layer 21L can include silicon oxide. The silicon-based dielectric material can be formed by a conformal deposition method such as low pressure chemical vapor deposition, atomic layer deposition, or a combination thereof. The thickness of the silicon-based dielectric material, if present, can be in a range from 1 nm to 20 nm, although lesser and greater thicknesses can also be employed. Alternatively, the lower blocking dielectric layer 21L can be omitted, and a blocking dielectric layer can be formed after formation of backside recesses by a conformal deposition process on surfaces of memory films to be subsequently formed.

Figure 6A:
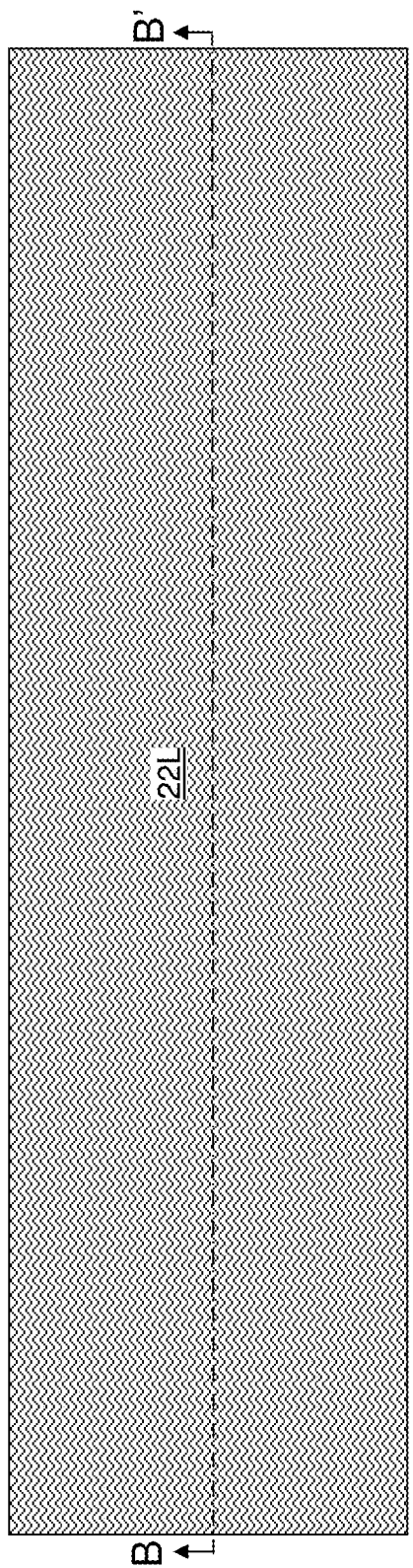
FIG. 6A is a top-down view of the exemplary structure after deposition of a first sacrificial fill material layer according to an embodiment of the present disclosure.
Figure 6B:
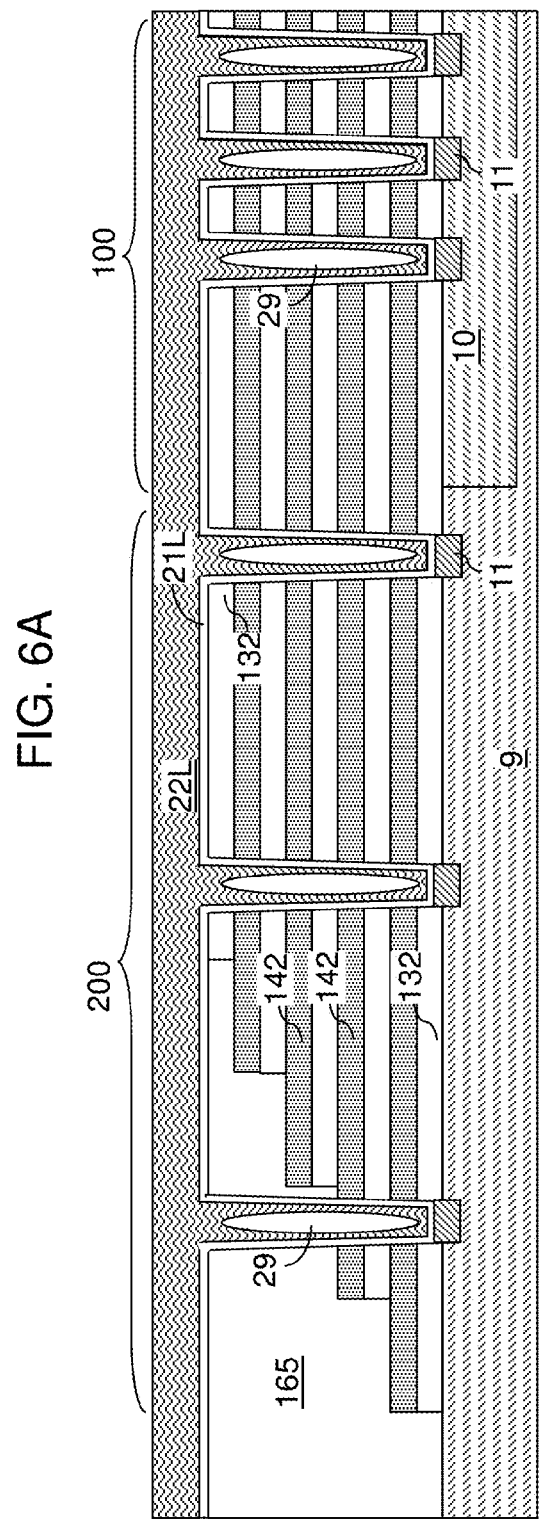
FIG. 6B is a vertical cross-sectional view of the exemplary structure of FIG. 6A along the vertical plane B-B'.

Referring to FIGS. 6A and 6B, a first sacrificial fill material layer 22L is deposited in the cavities of the first memory openings 121 and the first support openings 321, and over the alternating stack (132, 142) and the lower blocking dielectric layer 21L. The first sacrificial fill material layer 22L includes a first sacrificial fill material, which is a material that can be removed selective to the material of the lower blocking dielectric layer 21L. In one embodiment, the first sacrificial fill material can include a semiconductor material such as silicon (e.g., amorphous silicon or polysilicon), germanium, a silicon-germanium alloy. Alternatively, the first sacrificial fill material can include amorphous carbon, diamond-like carbon, or a porous organosilicate glass.

In one embodiment, the first sacrificial fill material layer 22L can be deposited employing a non-conformal deposition method. In this case, a first encapsulated cavity 29 can be formed within each first memory opening 121 and within each first support opening 321. As used here, a "cavity" refers to a volume that does not include a solid or a liquid material. A cavity may be under vacuum or may include a gas phase material. As used herein, an "encapsulated cavity" refers to a cavity that is encapsulated, i.e., a cavity that is inside a contiguous set of surfaces that do not have any opening therein. Thus, surfaces that define an encapsulated cavity are contiguous among one another, and do not include any gap thereamongst. A first encapsulated cavity 29 is formed within each first memory opening 121 and within each support opening 321 upon filling the first memory openings 121 and the first support openings 321 with the first sacrificial fill material. Each first encapsulated cavity 29 is encapsulated by a portion of the first sacrificial fill material within a respective first memory opening 121 or within a respective first support opening 321.

Referring to FIGS. 7A and 7B, at least one first contact trench 179 can be formed through the first alternating stack (132, 142), for example, by applying a photoresist layer (not shown), lithographically patterning the photoresist layer, and transferring the pattern in the photoresist layer through the first alternating stack (132, 142) employing an anisotropic etch. Each first contact trench 179 can extend from the top surface of the first sacrificial fill material layer 22L at least to the top surface of the semiconductor material layer 10. Dopants of a second conductivity type, which is the opposite of the first conductivity type of the semiconductor material layer 10, can be implanted into a surface portion of the semiconductor material layer 10 to form a source region 61. Each first contact trench 179 extends through the lower stack structure (132, 142, 165), and thus, is herein referred to as a lower level contact trench.

Figure 8A:
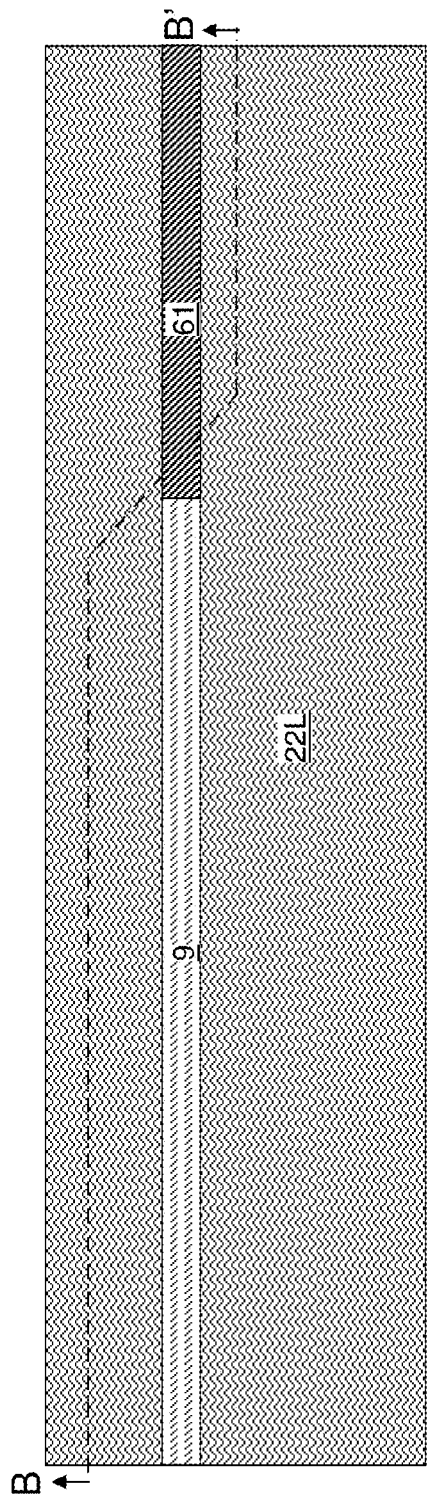
FIG. 8A is a top-down view of the exemplary structure after formation of first lateral recesses by removal of the first sacrificial material layers according to an embodiment of the present disclosure.
Figure 8B:
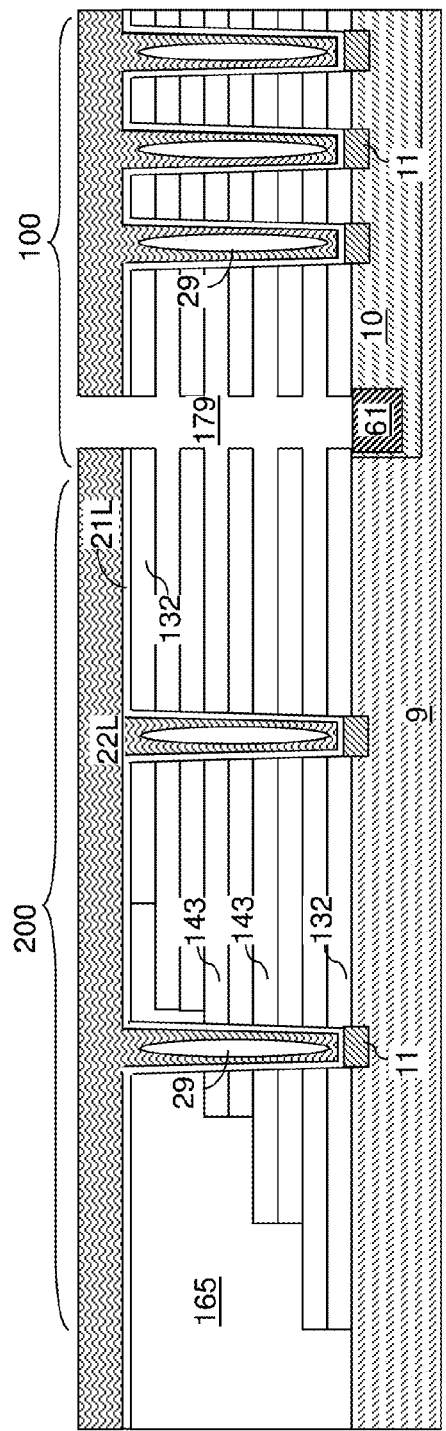
FIG. 8B is a vertical cross-sectional view of the exemplary structure of FIG. 8A along the vertical plane B-B'.

Referring to FIGS. 8A and 8B, an etchant that selectively etches the material of the first sacrificial material layers 142 with respect to the material of the first insulating layers 132 can be introduced into the first contact trench 179, for example, employing an isotropic etch process. First backside recesses 143 are formed in volumes from which the first sacrificial material layers 142 are removed. The removal of the material of the first sacrificial material layers 142 can be selective to the material of the first insulating layers 132, the material of the first retro-stepped dielectric material portion 165, the semiconductor material of the semiconductor material layer 10, and the material of the lower blocking dielectric layer 21L. In one embodiment, the first sacrificial material layers 142 can include silicon nitride, and the materials of the first insulating layers 132, and the first retro-stepped dielectric material portion 165 can be selected from silicon oxide and dielectric metal oxides. In another embodiment, the first sacrificial material layers 142 can include a semiconductor material such as germanium or a silicon-germanium alloy, and the materials of the first insulating layers 132 and the first retro-stepped dielectric material portion 165 can be selected from silicon oxide, silicon nitride, and dielectric metal oxides.

The isotropic etch process can be a wet etch process employing a wet etch solution, or can be a gas phase (dry) etch process in which the etchant is introduced in a vapor phase into the first contact trench 179. For example, if the first sacrificial material layers 142 include silicon nitride, the etch process can be a wet etch process in which the exemplary structure is immersed within a wet etch tank including phosphoric acid, which etches silicon nitride selective to silicon oxide, silicon, and various other materials employed in the art.

Each first backside recess 143 can be a laterally extending cavity having a lateral dimension that is greater than the vertical extent of the cavity. In other words, the lateral dimension of each first backside recess 143 can be greater than the height of the first backside recess 143. A plurality of first backside recesses 143 can be formed in the volumes from which the material of the first sacrificial material layers 142 is removed. Each of the plurality of first backside recesses 143 can extend substantially parallel to the top surface of the substrate (9, 10). A first backside recess 143 can be vertically bounded by a top surface of an underlying first insulating layer 132 and a bottom surface of an overlying first insulating layer 132. In one embodiment, each first backside recess 143 can have a uniform height throughout. Optionally, a backside blocking dielectric layer can be formed in the backside recesses.

Figure 9A:
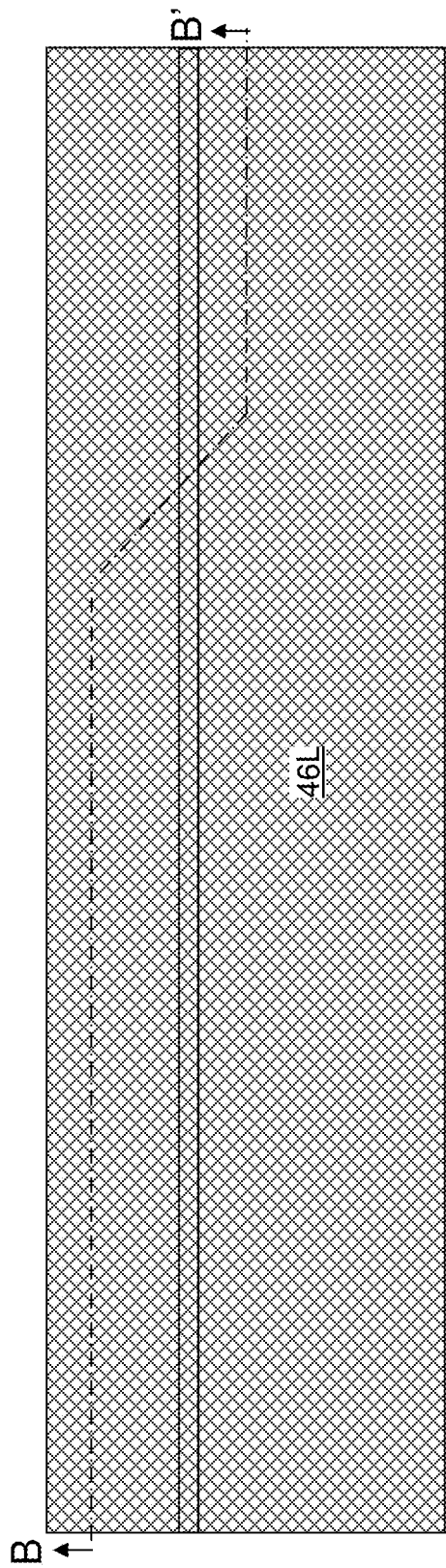
FIG. 9A is a top-down view of the exemplary structure after deposition of a conductive material to form first electrically conductive layers according to an embodiment of the present disclosure.
Figure 9B:
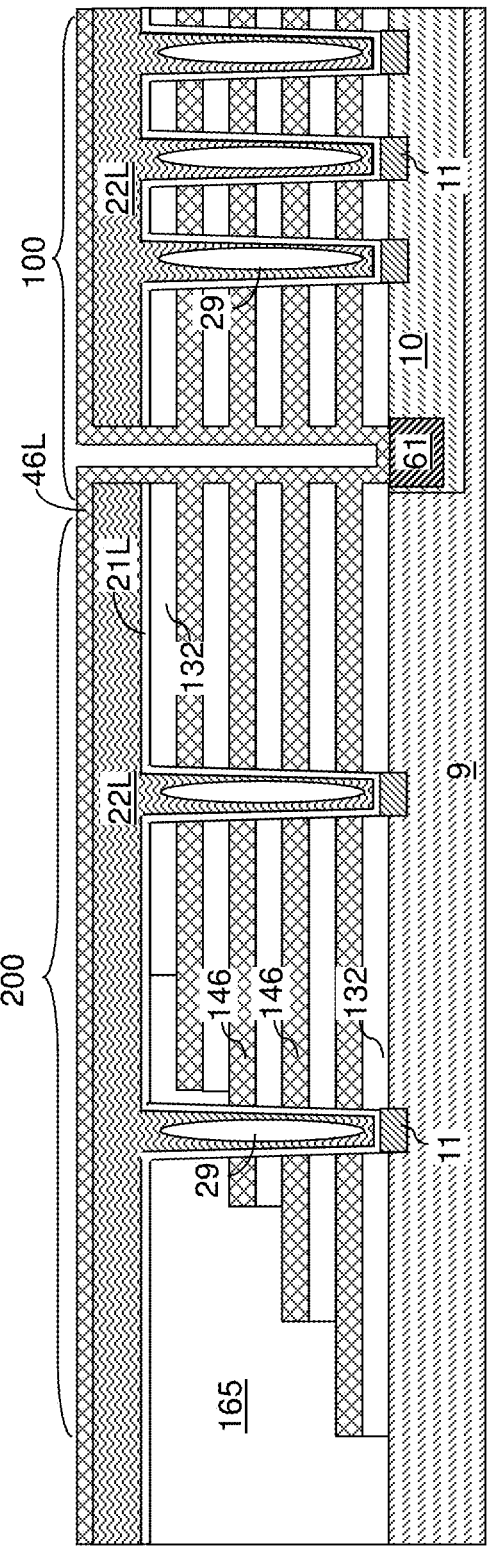
FIG. 9B is a vertical cross-sectional view of the exemplary structure of FIG. 9A along the vertical plane B-B'.

Referring to FIGS. 9A and 9B, at least one conductive material can be deposited in the plurality of first backside recesses 143, on the sidewalls of the first contact trench 179, and over the first sacrificial fill material layer 22L. The at least one conductive material can include at least one metallic material, i.e., an electrically conductive material that includes at least one metallic element.

A plurality of first electrically conductive layers 146 can be formed in the plurality of first backside recesses 143, and a contiguous metallic material layer 46L can be formed on the sidewalls of each first contact trench 179 and over the first sacrificial fill material layer 22L. Thus, each first sacrificial material layer 142 can be replaced with a first electrically conductive layer 146. A backside cavity is present in the portion of each first contact trench 179 that is not filled with the contiguous metallic material layer 46L.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of first backside recesses 143 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of first backside recesses 143 can be a combination of titanium nitride layer and a tungsten fill material. In one embodiment, the metallic material can be deposited by chemical vapor deposition or atomic layer deposition.

Figure 10A:
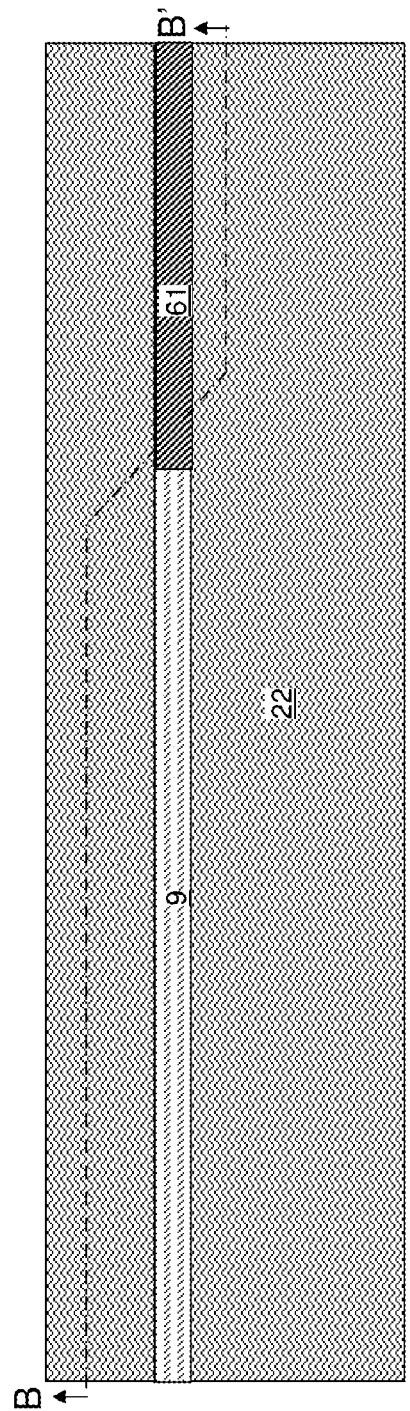
FIG. 10A is a top-down view of the exemplary structure after a recess etch that removes portions of the conductive material from the lower level contact trench and from above the first alternating stack according to an embodiment of the present disclosure.
Figure 10B:
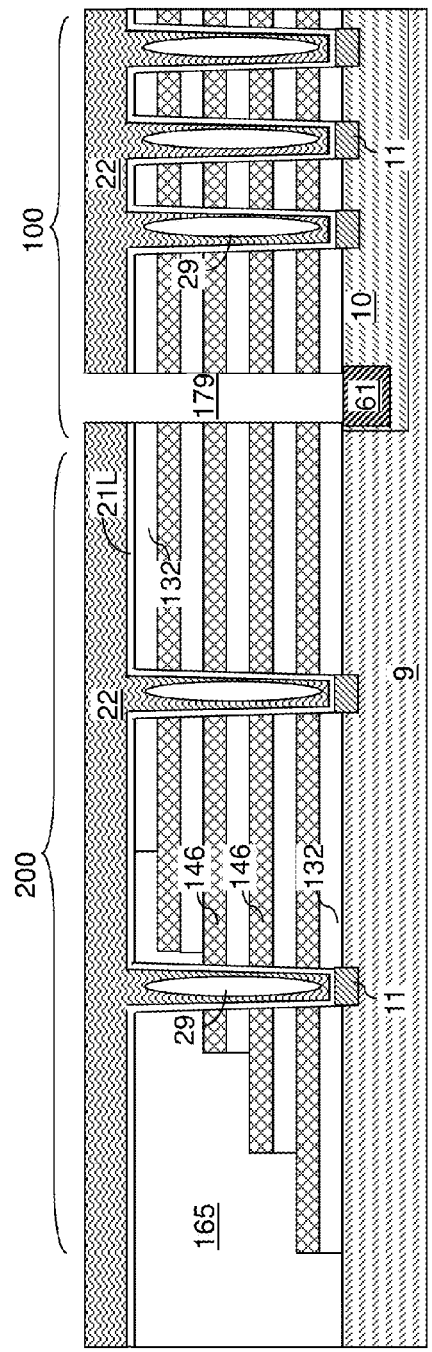
FIG. 10B is a vertical cross-sectional view of the exemplary structure of FIG. 10A along the vertical plane B-B'.

Referring to FIGS. 10A and 10B, the deposited metallic material of the contiguous metallic material layer 46L is etched back from the sidewalls of each first contact trench 179 and from above the first sacrificial fill material layer 22L, for example, by an isotropic etch. Each remaining portion of the deposited metallic material in the first backside recesses 143 constitutes a first electrically conductive layer 146. Each first electrically conductive layer 146 can be a conductive line structure. Thus, each first sacrificial material layer 142 can be replaced with a first electrically conductive layer 146.

Each first electrically conductive layer 146 can function as a combination of a plurality of control gate electrodes located at a same level and a word line electrically interconnecting, i.e., electrically shorting, the plurality of control gate electrodes located at the same level. The control gate electrodes within each first electrically conductive layer 146 are the control gate electrodes for the vertical memory devices to be subsequently formed.

Figure 11A:
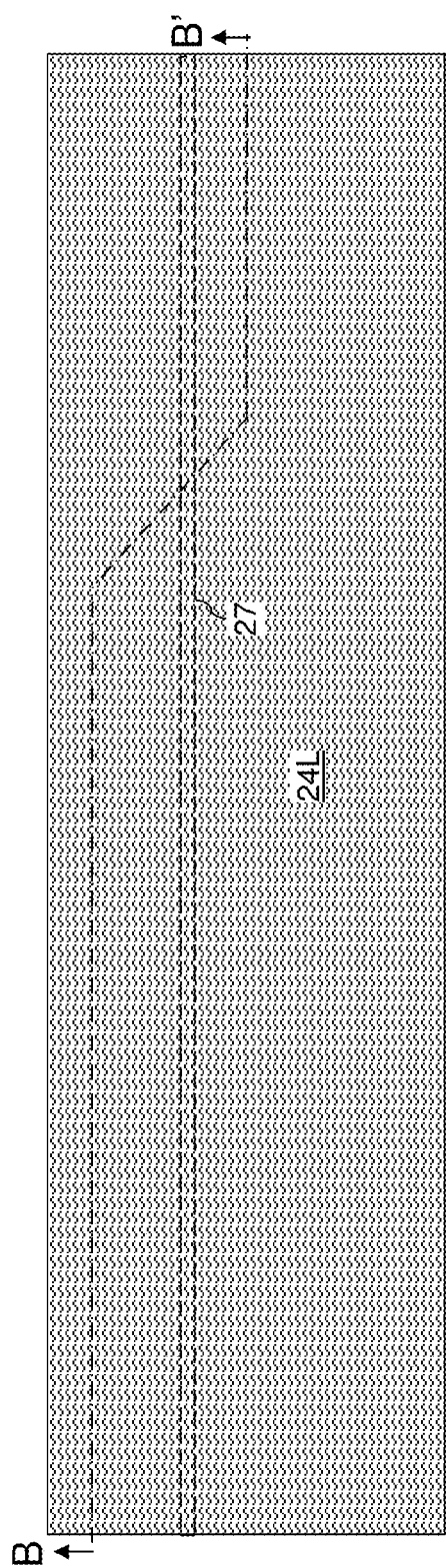
FIG. 11A is a top-down view of the exemplary structure after deposition of a second sacrificial fill material layer according to an embodiment of the present disclosure.
Figure 11B:
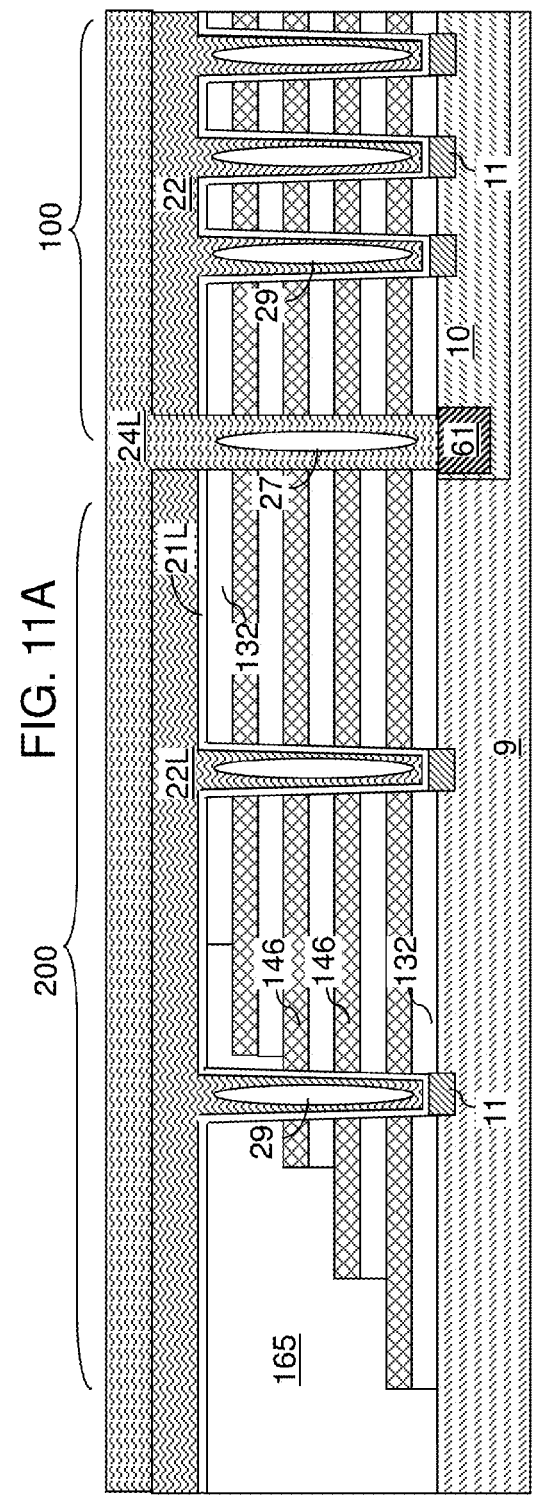
FIG. 11B is a vertical cross-sectional view of the exemplary structure of FIG. 11A along the vertical plane B-B'.

Referring to FIGS. 11A and 11B, a second sacrificial fill material layer 24L is deposited in each first contact trench 179 and over the first sacrificial fill material layer 22L. The second sacrificial fill material layer 24L includes a second sacrificial fill material, which is a material that can be removed selective to the materials of the first insulating layers 132 and the first electrically conductive layers 146. In one embodiment, the second sacrificial fill material can include a semiconductor material such as polysilicon, germanium, and/or a silicon-germanium alloy. Alternatively, the second sacrificial fill material can include amorphous carbon, diamond-like carbon, or a porous organosilicate glass. The second sacrificial fill material can be the same as, or can be different from, the first sacrificial fill material.

In one embodiment, the second sacrificial fill material layer 24L can be deposited employing a non-conformal deposition method. In this case, a second encapsulated cavity 27 can be formed within each first contact trench 179. A second encapsulated cavity 27 is formed within each first contact trench 179 upon filling the first contact trenches 179 with the second sacrificial fill material. Each second encapsulated cavity 27 is encapsulated by a portion of the second sacrificial fill material within a respective first contact trench 179.

Referring to FIGS. 12A and 12B, a planarization process is performed to remove portions of the first and second sacrificial fill material layers (21L, 22L) from above an alternating stack (132, 146) of the first insulating layers 132 and the first electrically conductive layers 146. In one embodiment, a chemical mechanical planarization (CMP) process can be employed to remove the first and second sacrificial fill material layers (21L, 22L) from above the alternating stack (132, 146). Optionally, the horizontal portion of the lower blocking dielectric layer 21L can be employed as a stopping layer for the CMP process. In one embodiment, the horizontal portion of the lower blocking dielectric layer 21L can be subsequently removed, for example, by an isotropic etch process or by a touch-up polish process. Each remaining portion of the first sacrificial fill material in a first memory opening or a first support opening constitutes a first sacrificial fill material portion 22 including a first encapsulated cavity 27. Each remaining portion of the second sacrificial fill material in a first contact trench constitutes a second sacrificial fill material portion 24 including a second encapsulated cavity 27. In one embodiment, the first sacrificial fill material portions 22 can form a two-dimensional array, which may have a periodicity along two different horizontal directions. Further, each second sacrificial fill material portion 24 can extend along a horizontal direction, which is herein referred to as a lengthwise direction of a second sacrificial fill material portion 24. Each remaining portion of the lower blocking dielectric layer 21L within a first memory opening or within a first support opening is herein referred to as a lower blocking dielectric 21. Each lower blocking dielectric 21 is formed directly on a sidewall of a first memory opening or a first support opening.

Referring to FIGS. 13A and 13B, a second alternating stack (232, 242) of material layers is subsequently formed on the top surface of the lower stack structure (132, 142, 165). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers and the fourth material layers can be second insulating layers 232 and second sacrificial material layers 242, respectively. The third material of the second insulating layers 232 can be at least one insulating material. The fourth material of the second sacrificial material layers 242 is a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

A dielectric cap layer 70 and a planarization stopping layer 72 can be subsequently formed over the second stack (232, 242). The dielectric cap layer 70 includes a dielectric material that is different from the material of the second sacrificial material layers 242. In one embodiment, the dielectric cap layer 70 can include silicon oxide. The planarization stopping layer 72 is an optional layer, and includes a dielectric material that is different from the material of the second sacrificial material layer 242 and can be employed as a planarization stopping material in a planarization process (which may be a chemical mechanical planarization process). For example, the planarization stopping layer 72 can include silicon nitride and/or a dielectric metal oxide.

Referring to FIGS. 14A and 14B, additional stepped surfaces are formed in the second stack (232, 242) in the contact region 200. The additional stepped surfaces are herein referred to as second stepped surfaces. The second stepped surfaces are formed in a second stepped area, which is adjacent to, and does not overlie, the first stepped area of the first stepped surfaces within the lower stack structure (132, 142, 165). The second stepped surfaces can be adjacent to, and do not overlie, the stepped interface between the first alternating stack (132, 146) and the first retro-stepped dielectric material portion 165.

The second stepped surfaces can be formed, for example, by forming a mask layer with an opening therein, etching a cavity within the levels of the topmost second sacrificial material layer 242 and the topmost second insulating layer 232, and iteratively expanding the etched area and vertically recessing the cavity by etching a pair of a second insulating layer 232 and a second sacrificial material layer 242 located directly underneath the bottom surface of the etched cavity within the etched area. The second stack (232, 242) is patterned such that each underlying second sacrificial material layer 242 laterally protrudes farther than any overlying second sacrificial material layer 242 in the etched region, and each underlying second insulating layer 232 laterally protrudes farther than any overlying second insulating layer 232 in the etched region. The etched area includes the area of the contact region 200, which includes the contact area for the second stack (232, 242) and a contact area for the first alternating stack (132, 142).

Thus, the second stack (232, 242) is patterned to form the second stepped surfaces thereupon. The cavity formed by removal of portions of the second stack (232, 242) is herein referred to as a second stepped cavity. The area of the second stepped cavity includes the area of the first retro-stepped first dielectric material portion 165, from which all layers of the second stack (232, 242) are removed. The area of the second stepped cavity further includes the area of the second stepped surfaces of the second stack (232, 242).

Dielectric material is deposited to fill the second stepped cavity. Excess portions of the dielectric material overlying the topmost surface of the second stack (232, 242) are removed, for example, by chemical mechanical planarization. The remaining portion of the deposited dielectric material is retro-stepped, and thus, forms a second retro-stepped dielectric material portion 265. The second retro-stepped dielectric material portion 265 is located on, and over, the second stepped surfaces of the second stack (232, 242). The second retro-stepped dielectric material portion 265 is formed on the second stepped surfaces. The contact region 200 comprises a region of the first stepped surfaces and a region of the second stepped surfaces.

Figures 15A, 15B:
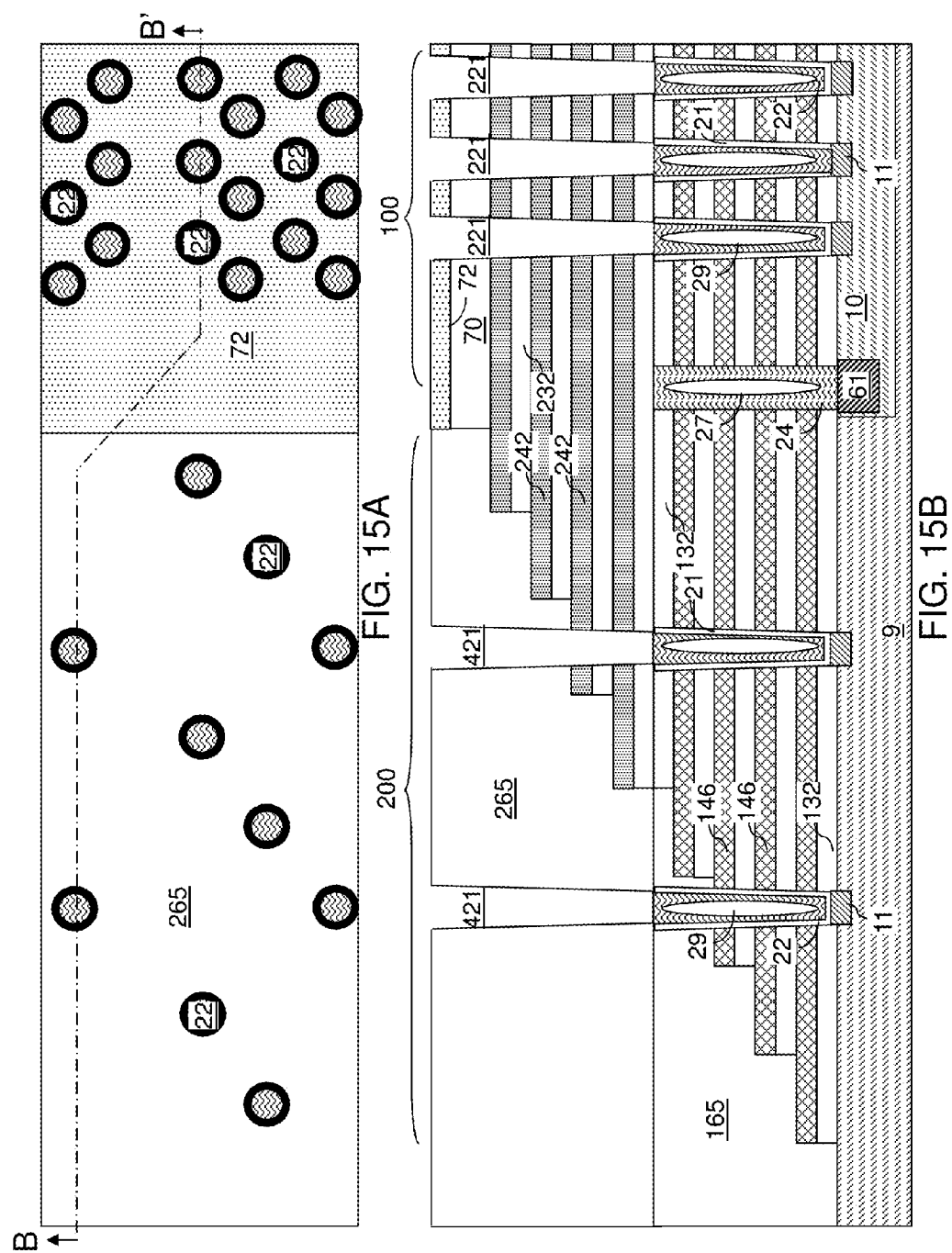
FIG. 15A is a top-down view of the exemplary structure after formation of second memory openings in the device region and second support openings in the contact region according to an embodiment of the present disclosure.
FIG. 15B is a vertical cross-sectional view of the exemplary structure of FIG. 15A along the vertical plane B-B'.

Referring to FIGS. 15A and 15B, second openings (221, 421) are formed through the upper stack structure (232, 242, 265, 70, 72) to the top surface of the lower stack structure (132, 142, 165). The second openings (221, 421) include second memory openings 221 that are formed in the device region 100 and second support openings 421 that are formed in the contact region 200. Each second memory opening 221 can be formed in an area that substantially coincides with the area of a respective first memory opening 121. Each second support opening 421 can be formed in an area that substantially coincides with the area of a respective first support opening 321.

For example, a lithographic material stack (not shown) including at least a photoresist layer can be formed over the upper stack structure (232, 242, 265, 70, 72), and can be lithographically patterned to form openings within the lithographic material stack. The pattern in the lithographic material stack can be transferred through the entirety of the upper stack structure (232, 242, 265, 70, 72) by at least one anisotropic etch that employs the patterned lithographic material stack as an etch mask. Portions of the upper stack structure (232, 242, 265, 70, 72) underlying the openings in the patterned lithographic material stack are etched to form the second openings (221, 421). In other words, the transfer of the pattern in the patterned lithographic material stack through the upper stack structure (232, 242, 265, 70, 72) forms the second openings (221, 421).

In one embodiment, the chemistry of the anisotropic etch process employed to etch through the materials of the second stack (232, 242) can alternate to optimize etching of the third and fourth materials in the second stack (232, 242) while providing a comparable average etch rate for the second dielectric material portion 265. The anisotropic etch can be, for example, a series of reactive ion etches. The sidewalls of the second openings (221, 421) can be substantially vertical, or can be tapered.

The second memory openings (221, 421) are formed through the upper stack structure (232, 242, 265, 70, 72) in areas overlying the first memory openings (121, 321), which are filled with the sacrificial opening fill structures (22, 24). The second support opening 421 can be formed through the second stack of alternating layers (232, 242) and through the second dielectric material portion 265 concurrently with formation of the second memory openings 221, which are formed through the second stack of alternating layers (232, 242). In one embodiment, the sacrificial opening fill structures (22, 24) can be employed as an endpoint detection layer to control the termination time of the anisotropic etch process.

The lateral dimensions (e.g., a diameter) of the second openings (221, 421) can be comparable to the lateral dimensions of the first openings (121, 321). For example, the lateral dimensions of the second openings (221, 421) can be from about 20 nm to 200 nm at an upper portion of each second opening (221, 421), and can be about 10 nm to 150 nm at a lower portion of each second opening (221, 421). In one embodiment, the second memory openings 221 and the first memory openings 121 can be formed as an array of openings, which can be a periodic two-dimensional array of openings. The second support openings 421 and the first support openings 321 can be formed as discrete openings that are mutually separated from one another, and may not form a periodic two-dimensional array pattern. The lateral separation distance among the second support openings 421 may be greater than twice (e.g., three time or more) than the nearest neighbor distance among the second memory openings 221.

Each bottom surface of the second memory openings 221 can be entirely within the area of a top surface of an underlying first sacrificial fill material portion 22. Each bottom surface of the second support openings 421 can be entirely within the area of a top surface of an underlying sacrificial fill material portion 24. Subsequently, the patterned lithographic material stack can be subsequently removed, for example, by ashing.

Referring to FIG. 16, a vertical stack of a first memory opening and a second memory opening is shown for a configuration in which a dielectric spacer 116 is provided at a sidewall of each epitaxial channel portion 11, and in which a gate dielectric layer 31 is employed in lieu of a bottommost first insulating layer 132. Such a configuration can be provided by oxidizing physically exposed sidewalls of the epitaxial channel portions 11 after formation of the first backside recesses 143 and prior to deposition of at least one conductive material to form the first electrically conductive layers 146, e.g., between the processing steps of FIGS. 8A and 8B and the processing steps of FIGS. 9A and 9B.

An upper blocking dielectric layer 41L can be deposited directly on the sidewalls of the second openings (221, 421) and physically exposed surfaces of the first sacrificial fill material portions 22, and over the second alternating stack (232, 242). The upper blocking dielectric layer 41L can include one or more of any of the materials that can be employed for the lower blocking dielectric layer 21L. The upper blocking dielectric layer 41L can be deposited employing the same processes that can be employed to deposit the lower blocking dielectric layer 21L. The composition of the upper blocking dielectric layer 41L can be the same as, or can be different from, the composition of the lower blocking dielectric layer 21L. The thickness of the upper blocking dielectric layer 41L can be the same as, or can be different from, the thickness of the lower blocking dielectric layer 21L. In one embodiment, the upper blocking dielectric layer 41L does not physically contact any portion of the underlying lower blocking dielectric 21.

A sacrificial liner 42L can be optionally formed over the upper blocking dielectric layer 41L. The sacrificial liner 42L includes a material that can be removed selective to the material of the upper blocking dielectric layer 41L and can provide protection for vertical portions of the upper blocking dielectric layer 41L during a subsequent anisotropic etch process that removes the horizontal portions of the upper blocking dielectric layer 41L. For example, the sacrificial liner 42L can include a material such as silicon, germanium, a silicon-germanium alloy, amorphous carbon, diamond-like carbon, or organosilicate glass. In one embodiment, the sacrificial liner 42L can include the same material as the material of the first sacrificial fill material portions 22. In one embodiment, the sacrificial liner 42L can be an amorphous silicon layer or a polysilicon layer. The thickness of the sacrificial liner 42L can be in a range from 1 nm to 20 nm, although lesser and greater thicknesses can also be employed.

Referring to FIG. 17, an anisotropic etch is performed to remove horizontal portions of the sacrificial liner 42L and the upper blocking dielectric layer 41L. An upper portion of each first sacrificial fill material portion 22 is anisotropically etched within each first memory opening located underneath a second memory opening. The anisotropic etch removes an upper cap portion of each first sacrificial material fill portion 22 such that the encapsulated cavities 29 are connected to an overlying cavity volume and become open cavities 29'. In other words, a volume of each encapsulated cavity 29 is contiguously adjoined to a volume of an overlying second memory opening so that the encapsulated cavity 29 becomes an open cavity 29'. As used herein, an "open cavity" refers to a cavity that is contiguously connected to another volume that is not filled with a solid or a liquid. Each remaining portion of the upper blocking dielectric layer 41L within a second memory opening or within a second support opening constitutes an upper blocking dielectric 41.

Figure 18:
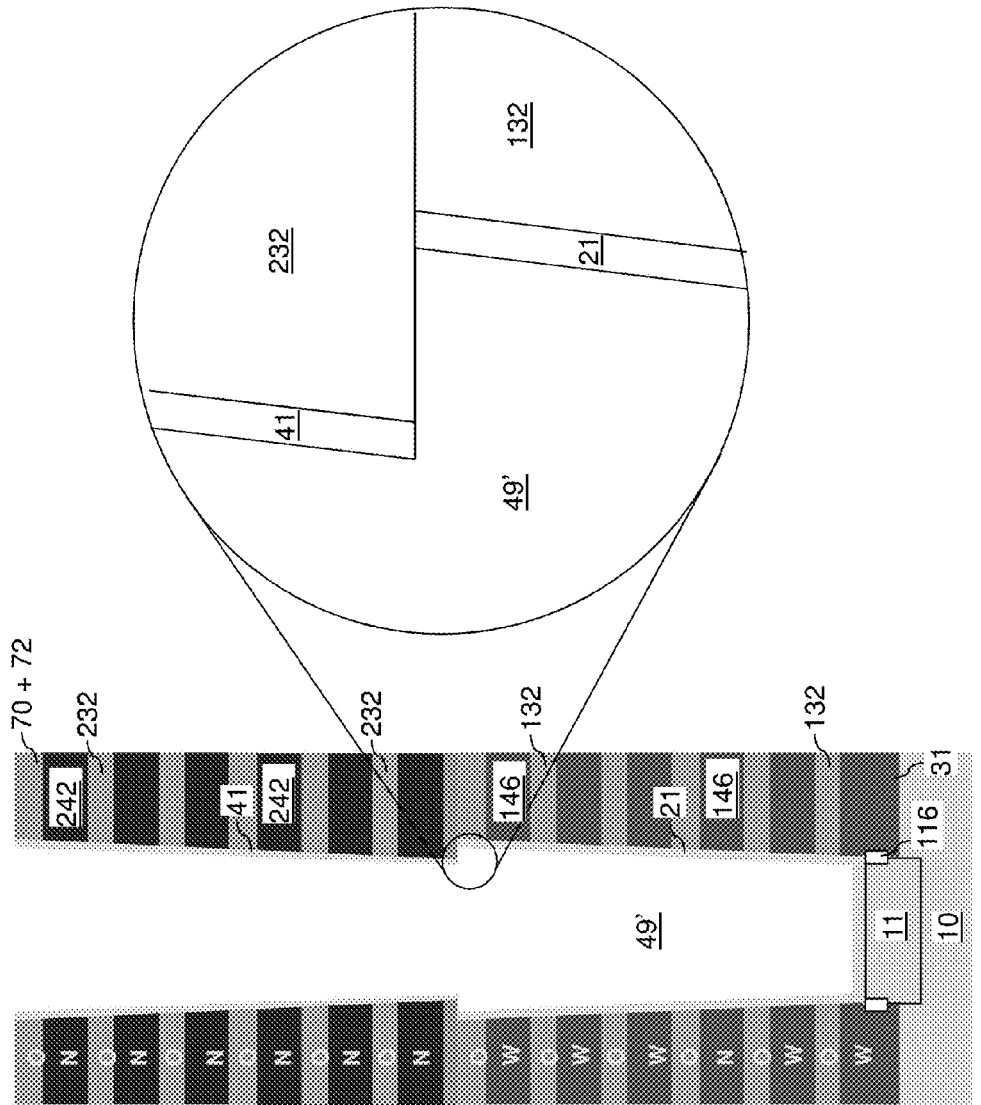
FIG. 18 is a vertical cross-sectional view of the stack of the first and second memory openings after removal of the first sacrificial fill material and the sacrificial liner according to an embodiment of the present disclosure.

Referring to FIG. 18, the materials of the sacrificial liner 42L and the first sacrificial fill material portions 22 are removed by an isotropic etch selective to the materials of the lower blocking dielectrics 21 and the upper blocking dielectrics 41. The etchant of the isotropic etch process can simultaneously access the sidewall portions and the bottom portions of the sacrificial fill material portions 22 through the open cavities 29'. Bottommost horizontal portions of each upper blocking dielectric 41 may be removed or reduced in size during the isotropic etch that removes the materials of the sacrificial liner 42L and the first sacrificial fill material portions 22. The isotropic etch that removes the materials of the materials of the sacrificial liner 42L and the first sacrificial fill material portions 22 can have high selectivity to the materials of the lower blocking dielectrics 21 and the upper blocking dielectrics 41 so as to minimize collateral damage of the lower blocking dielectrics 21 and the upper blocking dielectrics 41. In one embodiment, an upper blocking dielectric 41 can be physically disjoined from, i.e., not in physical contact with, an underlying blocking dielectric 21, as shown in the inset in FIG. 18.

A stack of a first memory opening in the lower stack structure (132, 146, 165) and a second memory opening in the upper stack structure (232, 246, 265, 70, 72) collectively constitutes an inter-stack memory opening. Each inter-stack memory opening can include a volume of a vertically adjoining pair of a first memory opening and a second memory opening, and can extend through the lower stack structure (132, 146, 165) and the upper stack structure (232, 246, 265, 70, 72).

Figure 19:
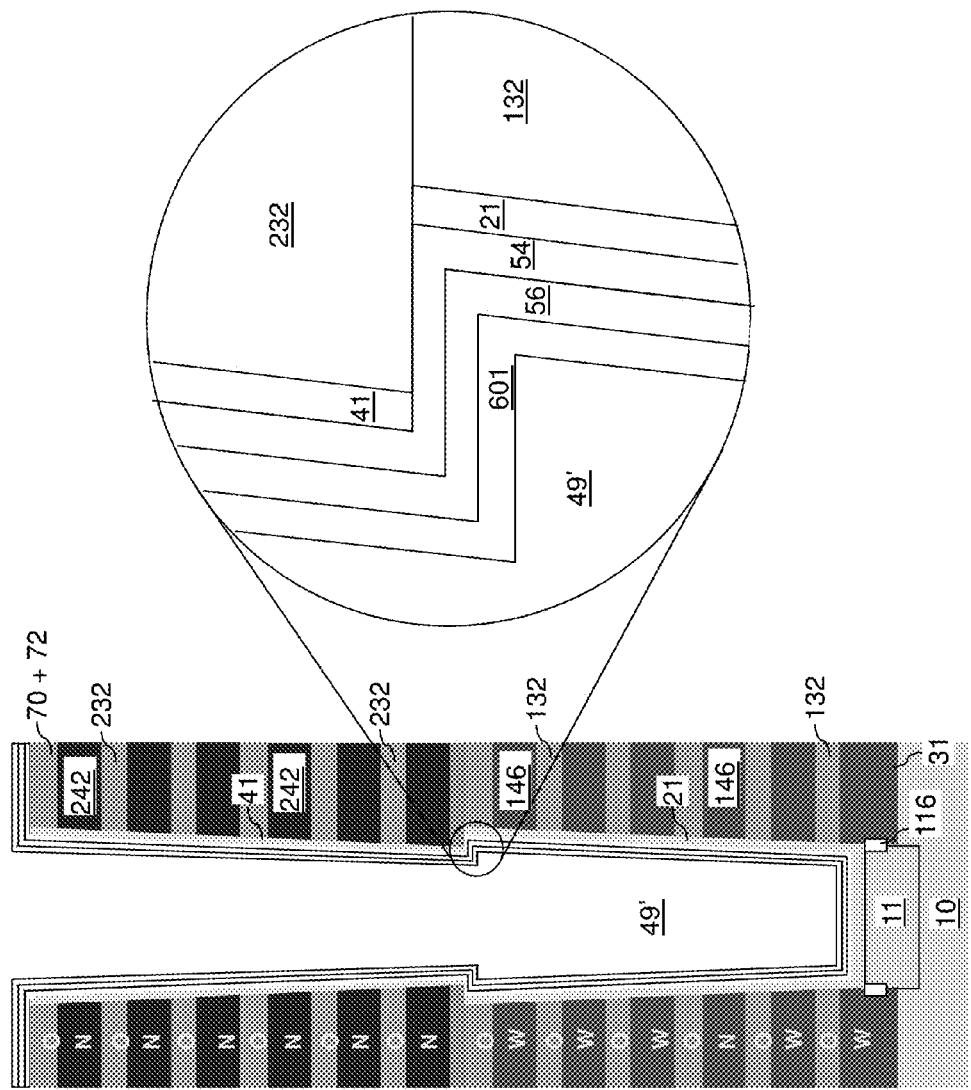
FIG. 19 is a vertical cross-sectional view of the stack of the first and second memory openings after formation of a memory material layer, a tunneling dielectric layer, and a first semiconductor channel layer according to an embodiment of the present disclosure.

Referring to FIG. 19, a memory material layer 54, a tunneling dielectric layer 56, and a first semiconductor channel layer 601 can be sequentially deposited as conformal material layers in the inter-stack memory openings and over the upper stack structure (232, 246, 265, 70, 72). In one embodiment, the memory material layer 54 can be a charge trapping material including a dielectric charge trapping material, which can be, for example, silicon nitride. The memory material layer 54 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 54 may comprise an insulating charge trapping material, such as one or more silicon nitride segments. Alternatively, the memory material layer 54 may comprise conductive nanoparticles such as metal nanoparticles, which can be, for example, ruthenium nanoparticles. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack.

In one embodiment, the ONO stack can be formed by deposition of a silicon oxide layer, nitridation of a surface portion of the silicon oxide layer into a silicon oxynitride layer, and oxidation of a surface portion of the silicon oxynitride layer into the second silicon oxide layer. The portion of the silicon oxide layer that is not converted into the silicon oxynitride layer is the first silicon oxide layer within the ONO stack, and the portion of the silicon oxynitride layer that is not converted into the second silicon oxide layer is the silicon oxynitride layer within the ONO stack. Alternatively, the second silicon oxide layer can be formed by deposition of silicon oxide on the inner sidewalls of the silicon oxynitride layer that is formed by nitridation. In one embodiment, the tunneling dielectric layer 56 can include a silicon oxide layer that is substantially free of carbon and/or a silicon oxynitride layer that is substantially free of carbon. The thickness of the tunneling dielectric layer 56 can be in a range from 2 nm to 20 nm, although lesser and greater thicknesses can also be employed.

The first semiconductor channel layer 601 can be formed over the tunneling dielectric layer 56. The first semiconductor channel layer 601 can be deposited directly on the tunneling dielectric layer 56. The first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is present in each inter-stack memory opening after formation of the first semiconductor channel layer 601.

Figure 20:
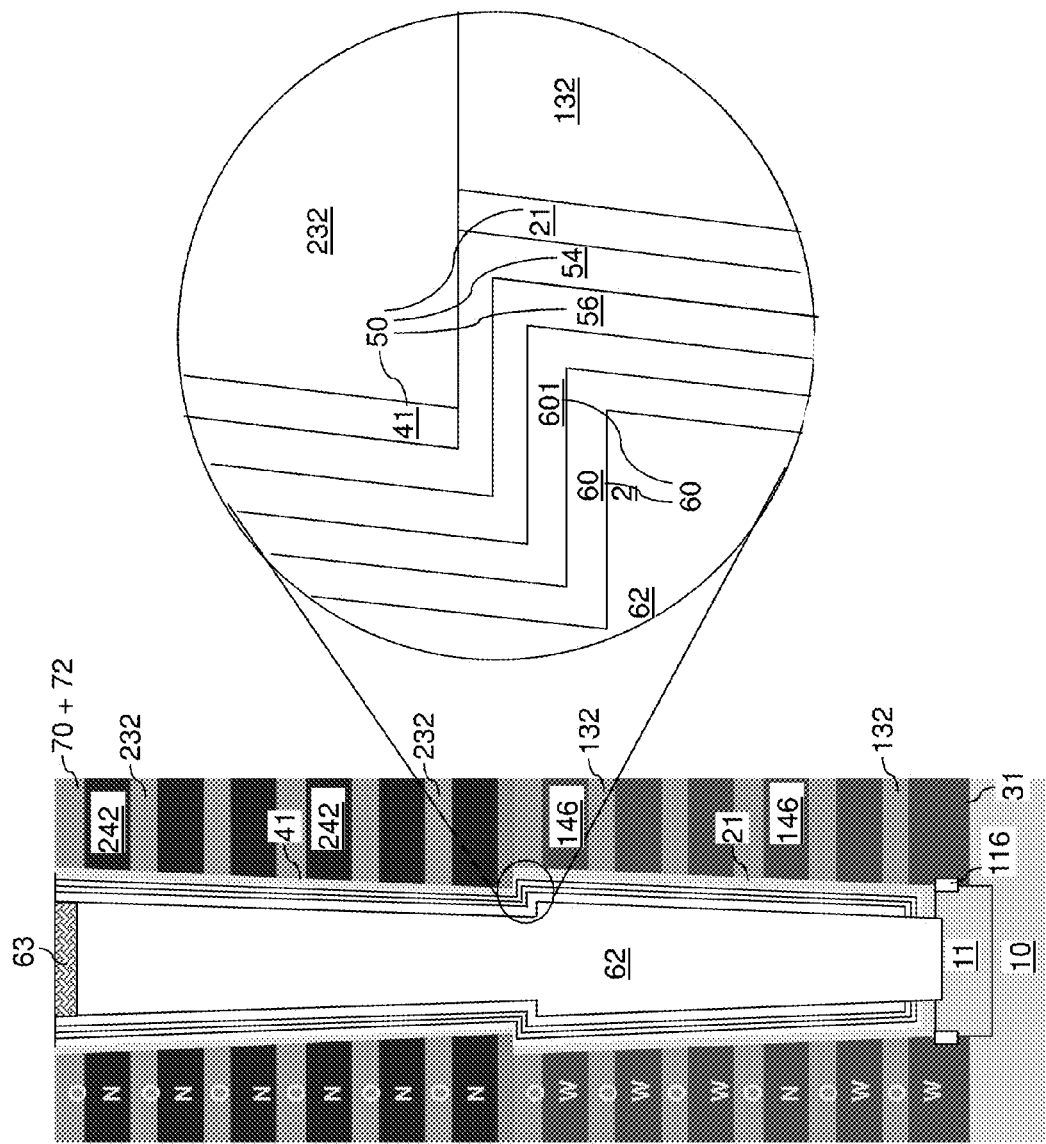
FIG. 20 is a vertical cross-sectional view of the stack of the first and second memory openings after formation of a second semiconductor channel layer, a dielectric core, and a drain region according to an embodiment of the present disclosure.

Referring to FIG. 20, an anisotropic etch is performed to remove horizontal portions of the first semiconductor channel layer 601, the tunneling dielectric layer 56, the memory material layer 54, and the lower blocking dielectrics 21 and to physically expose a surface of each epitaxial channel portion 11 (or layer 10 is portion 11 is omitted). Each contiguous set of a lower blocking dielectric 21, an upper blocking dielectric 41, a remaining portion the tunneling dielectric layer 56, an a remaining portion of the memory material layer 54 within a same inter-stack memory opening constitutes a memory film 50.

A second semiconductor channel layer 602 can be deposited on remaining vertical portions of the first semiconductor channel layer 601 and on top surface of the epitaxial channel portions 11. The second semiconductor channel layer 602 includes a semiconductor material, which can be any semiconductor material that can be employed for the first semiconductor channel layer 601. The first and second semiconductor channel layers (601, 602) can have a doping of the first conductivity type (i.e., the same conductivity type as the semiconductor material layer 10) or can be substantially intrinsic. As used herein, a semiconductor material is substantially intrinsic if the dopant concentration does not exceed $1.0 \times 10^{16}/cm^3$. In one embodiment, the second semiconductor channel layer 602 can include amorphous silicon or polysilicon. The thickness of the second semiconductor channel layer 602 can be in a range from 2 nm to 10 nm, although lesser and greater thicknesses can also be employed.

In case the cavity 49' in each inter-stack memory opening is not completely filled by the semiconductor channel layers (601, 602), a dielectric core layer can be deposited in the cavity 49' to fill any remaining portion of the cavity 49' within each inter-stack memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

Subsequently, the horizontal portion of the dielectric core layer can be removed, for example, by a recess etch from above the top surface of the insulating cap layer 70 and the optional planarization stopping layer 72. For example, the horizontal portion of the second semiconductor channel layer 602 located above the top surface of the planarization stopping layer 72 can be removed by a planarization process, which can employ a recess etch or chemical mechanical planarization (CMP). Each remaining portion of the first and second semiconductor channel layers (601, 602) within an inter-stack memory opening constitutes a semiconductor channel 60, which is a vertical portion of a composite semiconductor channel that further includes a horizontal semiconductor channel that is present between the epitaxial channel portions 11 and the source regions 61 in an upper portion of the semiconductor material layer 10.

Electrical current can flow through the semiconductor channel 60 when a vertical NAND device including the semiconductor channel 60 is turned on. A tunneling dielectric 56 is laterally surrounded by a memory material layer 54, and laterally surrounds a portion of the semiconductor channel 60. Each memory film 50 can store electrical charges with a macroscopic retention time. As used herein, a macroscopic retention time refers to a retention time suitable for operation of a memory device as a permanent memory device such as a retention time in excess of 24 hours.

The top surface of the remaining portion of the dielectric core layer can be further recessed within each memory opening, for example, by a recess etch to a depth that is located between the top surface of the insulating cap layer 70 and the bottom surface of the insulating cap layer 70. Each remaining portion of the dielectric core layer constitutes a dielectric core 62.

A drain region 63 can be formed by depositing a doped semiconductor material within each recessed region above the dielectric cores 62. The doped semiconductor material can be, for example, doped polysilicon. Excess portions of the deposited semiconductor material can be removed from above the top surface of the planarization stopping layer 72, for example, by chemical mechanical planarization (CMP) or a recess etch to form the drain region 63.

Figure 22A:
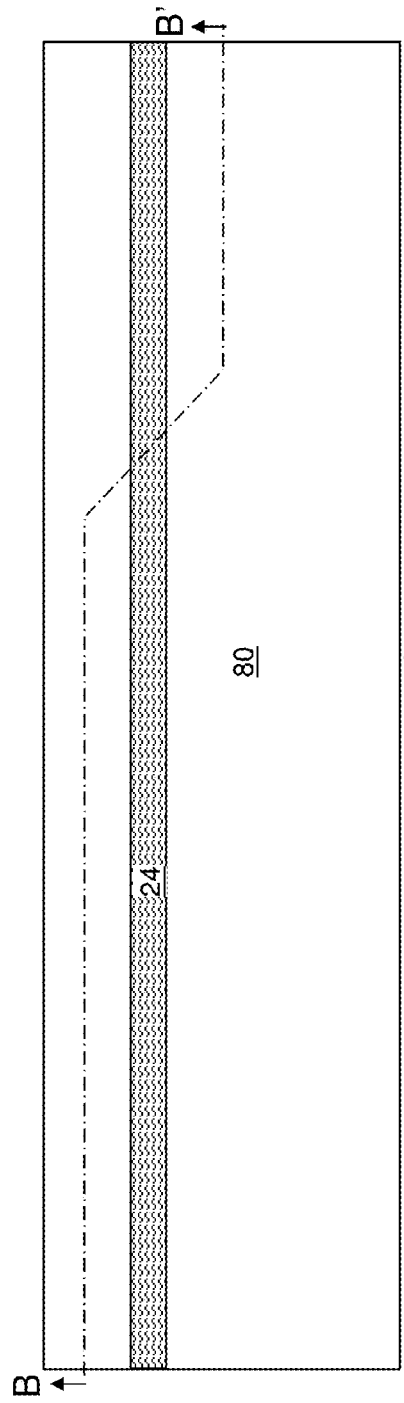
FIG. 22A is a top-down view of the exemplary structure after formation of an upper level contact trench according to an embodiment of the present disclosure.
Figure 22B:
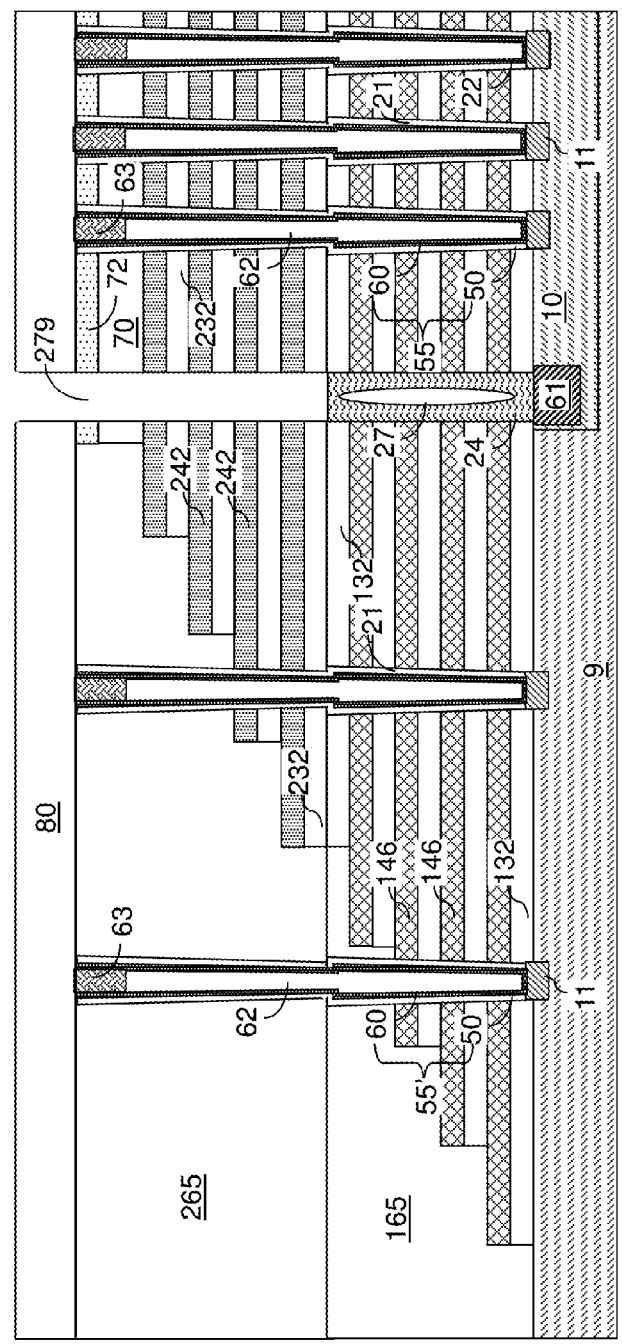
FIG. 22B is a vertical cross-sectional view of the exemplary structure of FIG. 22A along the vertical plane B-B'.

FIGS. 21A and 22B illustrate the exemplary structure after the processing steps of FIG. 20, which form memory stack structures 55, dummy memory stack structures 55', the dielectric cores 62, and the drain regions. Each memory stack structure 55 includes a combination of a memory film 50 and a semiconductor channel 60 within a vertical stack of a first memory opening and a second memory opening (i.e., an inter-stack memory opening). Each dummy memory stack structure 55' includes a combination of a memory film 50 and a semiconductor channel 60 within a vertical stack of a first support opening and a second support opening (i.e., an inter-stack support opening).

Referring to FIGS. 22A and 22B, a contact level dielectric layer 80 can be optionally deposited over the upper stack structure (232, 242, 265, 70, 72). The contact level dielectric layer 80 includes a dielectric material that is different from the material of the second sacrificial fill material layers 242. For example, the contact level dielectric layer 80 can include silicon oxide. The thickness of the contact level dielectric layer 80 can be in a range from 20 nm to 500 nm, although lesser and greater thicknesses can also be employed.

At least one second contact trench 279 can be formed through the second alternating stack (232, 242), for example, by applying a photoresist layer (not shown), lithographically patterning the photoresist layer, and transferring the pattern in the photoresist layer through the second alternating stack (232, 242) employing an anisotropic etch. Each second contact trench 279 is formed in an area overlying a first contact trench 179 that is filled with a second sacrificial fill material portion 24. Each second contact trench 279 can extend through the upper stack structure (232, 242, 265, 70, 72), and thus, is herein referred to as an upper level contact trench. The anisotropic etch that forms the at least one second contact trench 279 can stop on the second sacrificial fill material portions 24.

Figure 23A:
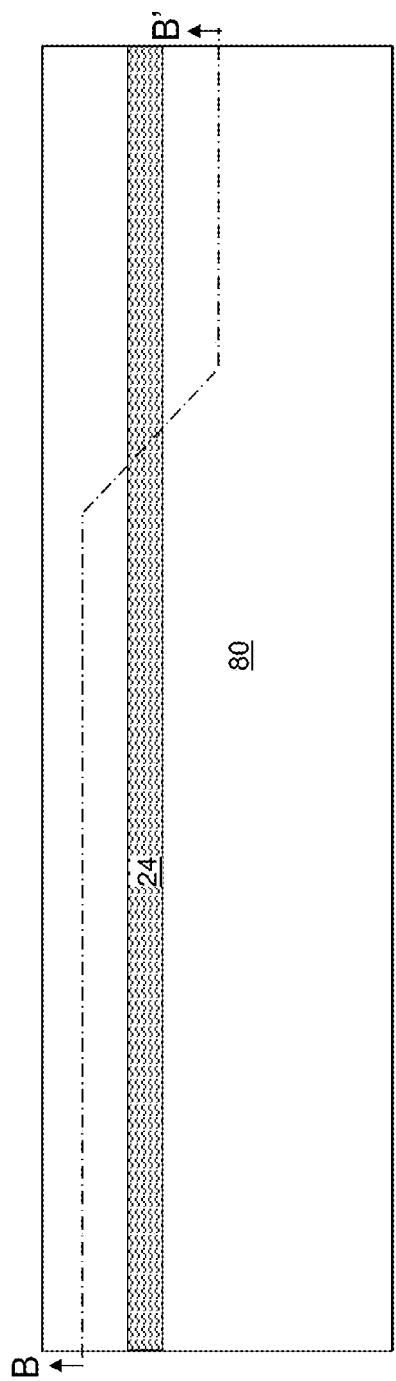
FIG. 23A is a top-down view of the exemplary structure after formation of second lateral recesses by removal of the second sacrificial material layers according to an embodiment of the present disclosure.
Figure 23B:
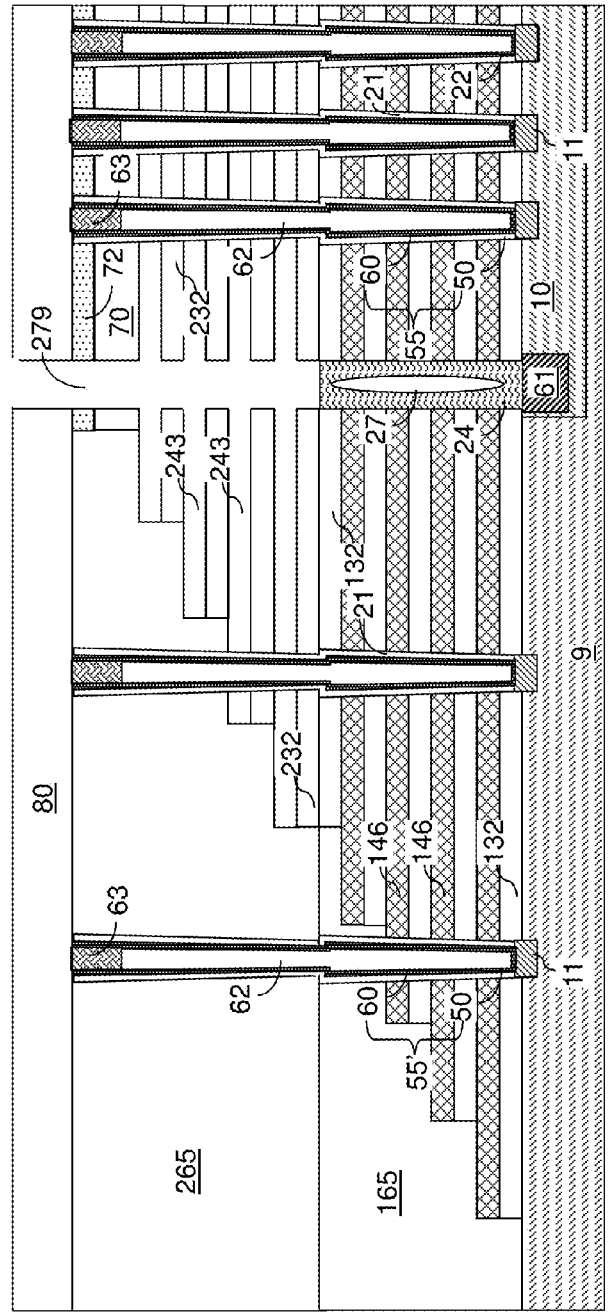
FIG. 23B is a vertical cross-sectional view of the exemplary structure of FIG. 23A along the vertical plane B-B'.

Referring to FIGS. 23A and 23B, an etchant that selectively etches the material of the second sacrificial material layers 242 with respect to the material of the second insulating layers 232 can be introduced into the second contact trench 279, for example, employing an isotropic etch process. Second backside recesses 243 are formed in volumes from which the second sacrificial material layers 242 are removed. The removal of the material of the second sacrificial material layers 242 can be selective to the material of the second insulating layers 232, the material of the second retro-stepped dielectric material portion 165, the material of the second sacrificial fill material portions 24, and the material of the upper blocking dielectrics 41. In one embodiment, the second sacrificial material layers 242 can include silicon nitride, and the materials of the second insulating layers 232, and the second retro-stepped dielectric material portion 265 can be selected from silicon oxide and dielectric metal oxides. In another embodiment, the second sacrificial material layers 242 can include a semiconductor material such as germanium or a silicon-germanium alloy, and the materials of the second insulating layers 232 and the second retro-stepped dielectric material portion 265 can be selected from silicon oxide, silicon nitride, and dielectric metal oxides.

The isotropic etch process can be a wet etch process employing a wet etch solution, or can be a gas phase (dry) etch process in which the etchant is introduced in a vapor phase into the second contact trench 279. For example, if the second sacrificial material layers 242 include silicon nitride, the etch process can be a wet etch process in which the exemplary structure is immersed within a wet etch tank including phosphoric acid, which etches silicon nitride selective to silicon oxide, silicon, and various other materials employed in the art.

Each second backside recess 243 can be a laterally extending cavity having a lateral dimension that is greater than the vertical extent of the cavity. In other words, the lateral dimension of each second backside recess 243 can be greater than the height of the second backside recess 243. A plurality of second backside recesses 243 can be formed in the volumes from which the material of the second sacrificial material layers 242 is removed. Each of the plurality of second backside recesses 243 can extend substantially parallel to the top surface of the substrate (9, 10). A second backside recess 243 can be vertically bounded by a top surface of an underlying second insulating layer 232 and a bottom surface of an overlying second insulating layer 232. In one embodiment, each second backside recess 243 can have a uniform height throughout. Optionally, a backside blocking dielectric layer can be formed in the backside recesses.

Figure 24A:
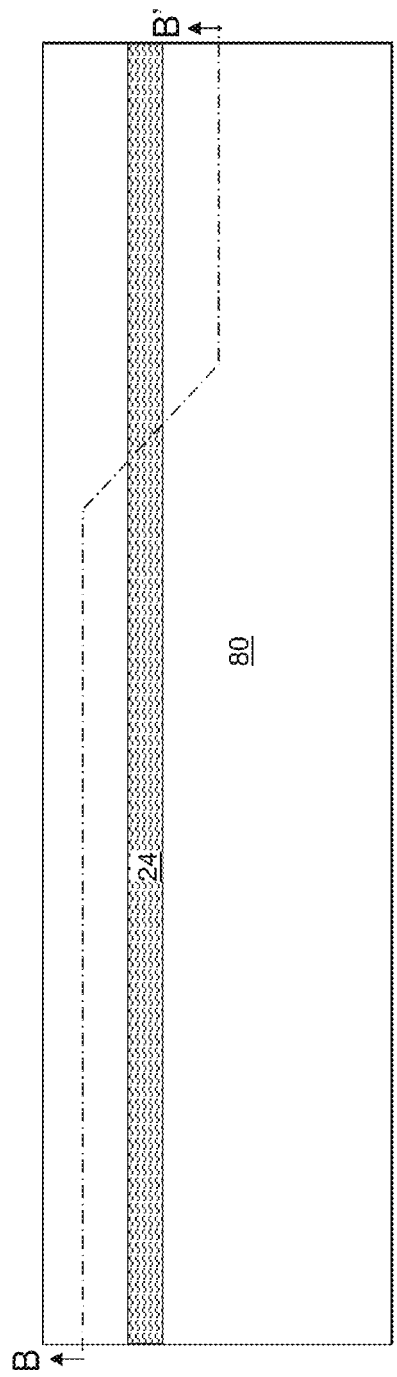
FIG. 24A is a top-down view of the exemplary structure after formation of second electrically conducive layers according to an embodiment of the present disclosure.
Figure 24B:
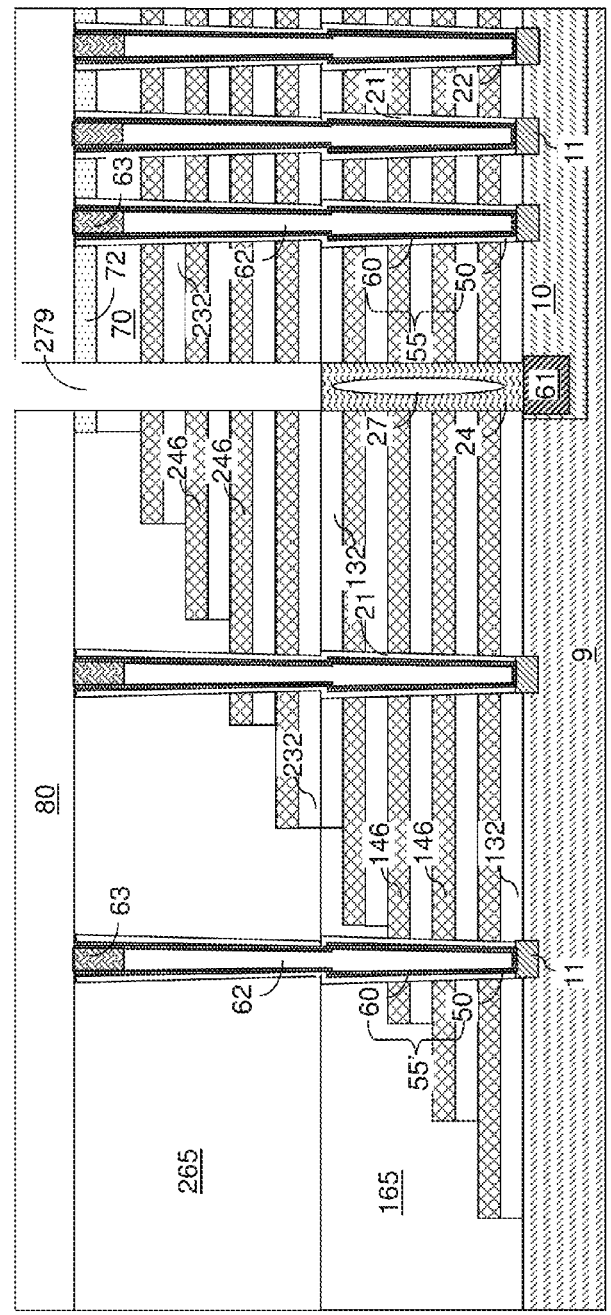
FIG. 24B is a vertical cross-sectional view of the exemplary structure of FIG. 24A along the vertical plane B-B'.

Referring to FIGS. 24A and 24B, the processing steps of FIGS. 9A, 9B, 10A, and 10B can be performed to deposit at least one conductive material in the plurality of second backside recesses 243, and to etch back the at least one conductive material from the sidewalls of each second contact trench 279 and from above the contact level dielectric layer 80, for example, by an isotropic etch. Each remaining portion of the deposited metallic material in the second backside recesses 243 constitutes a second electrically conductive layer 246. Each second electrically conductive layer 246 can be a conductive line structure. Thus, each second sacrificial material layer 242 can be replaced with a second electrically conductive layer 246.

According to an embodiment of the present disclosure, replacement of the first sacrificial material layers 142 with the first electrically conductive layers 146 can be performed by supplying a first etchant and at least one conductive material through the first contact trench 179 prior to formation of the upper stack structure (232, 242, 265, 70, 72). Replacement of the second sacrificial material layers 242 with the second electrically conductive layers 246 can be performed by supplying a second etchant and at least another conductive material through the second contact trench 279 while the second sacrificial fill material is present within the first contact trench 179.

Each second electrically conductive layer 246 can function as a combination of a plurality of control gate electrodes located at a same level and a word line electrically interconnecting, i.e., electrically shorting, the plurality of control gate electrodes located at the same level. The control gate electrodes within each second electrically conductive layer 246 are the control gate electrodes for the vertical memory devices to be subsequently formed.

Figure 25A:
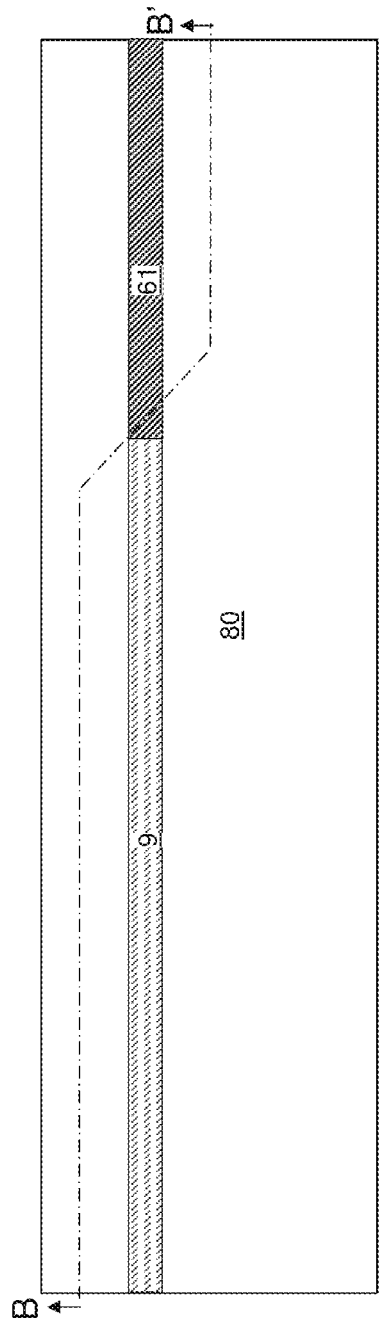
FIG. 25A is a top-down view of the exemplary structure after removal of a second sacrificial fill material portion according to an embodiment of the present disclosure.
Figure 25B:
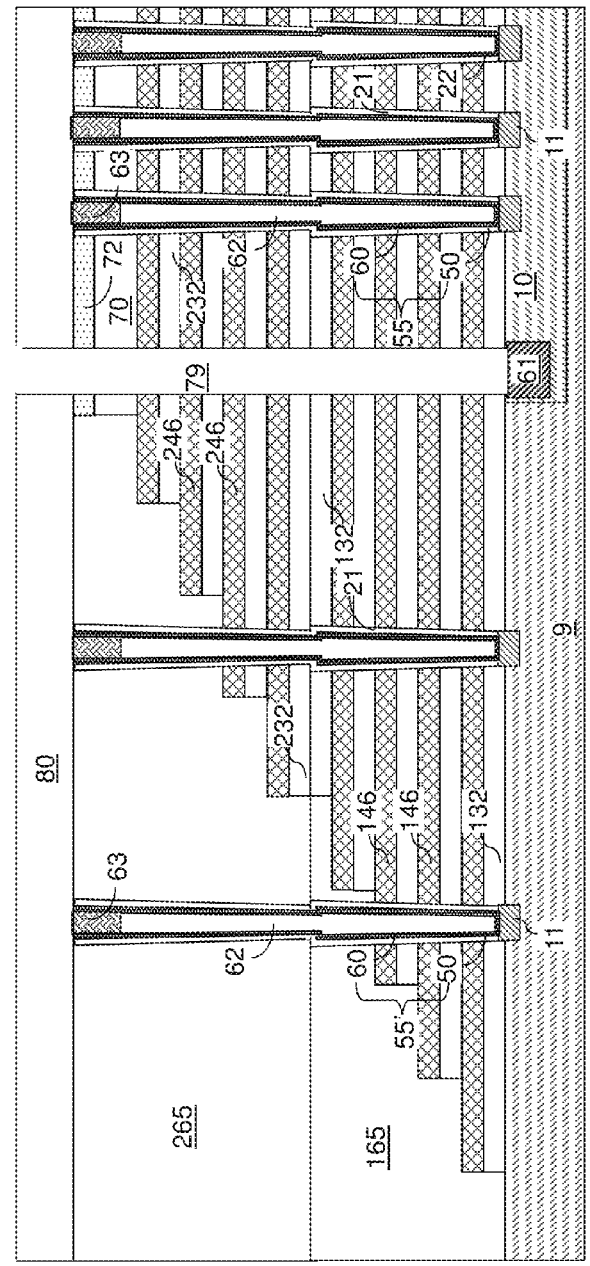
FIG. 25B is a vertical cross-sectional view of the exemplary structure of FIG. 25A along the vertical plane B-B'.

Referring to FIGS. 25A and 25B, each second sacrificial fill material portion 24 can be removed from a first contact trench 179 after replacement of the second sacrificial material layers 242 with the second electrically conductive layers 246. An anisotropic etch, an isotropic etch, or a combination thereof can be employed to remove the second sacrificial fill material portions 24 selective to the first and second insulating layers (132, 232), the first and second electrically conductive layers (146, 246), and the source regions 61. In one embodiment, an anisotropic etch can be employed to etch the cap portion of each second sacrificial fill material portion 24 to convert each second encapsulated cavity 27 into an open cavity, and an isotropic etch can be employed to etch the remaining portion of the second sacrificial fill material portion 24 from within the open cavity. A top surface of each source region 61 is physically exposed within a backside contact trench 79, which includes the volumes of a first contact trench 179 and a second contact trench 279.

Referring to FIGS. 26A and 26B, an insulating spacer 74 is formed within each backside contact trench 79 by a conformal deposition of a dielectric material layer and an anisotropic etch that removes the horizontal portions of the dielectric material layer. At least one conductive material is deposited within the cavity enclosed by the insulating spacer 74, and excess portion of the at least one conductive material is removed from above a horizontal plane including a top surface of the contact level dielectric layer 80. A remaining portion of the at least one conductive material within the insulating spacer 74 constitutes a backside contact via structure 76.

Control gate contact via structures 66 can be formed through the contact level dielectric layer 80 and the second and/or first retro-stepped dielectric material portions (165, 265) to provide electrical contact to the first and second electrically conductive layers (146, 246). Array contact via structures 88 can be formed through the contact level dielectric layer 80 to provide electrical contact to the drain regions 63.

While two stacks (132, 146) and (232, 246) are illustrated and described above, it should be understood that more than two stacks, such as three to ten stacks, such as four to six stacks, may be formed using the above described method. In the above described method, the steps, the memory openings and the support openings (if needed) are formed in a first stack, and the memory and support openings are then filled with a sacrificial material. Backside contact trenches(s) are then formed in the first stack, the sacrificial material layers are replaced with electrically conductive layers, and the backside contact via trenches are then filled with another sacrificial material. A second stack is then formed on the first stack. If only two stacks are used in the memory device, then the method is completed as described above.

Alternatively, if more than two stacks are used in the memory device, then the above process steps for the first stack are repeated for each subsequent stack that is not the top stack in the device. Thus, for the second, third, fourth, etc. stacks in the device, the steps, the memory openings and the support openings (if needed) are formed in each deposited stack, and the memory and support openings are then filled with a sacrificial material. Backside contact via trench(es) are then formed in the each deposited stack, the sacrificial material layers are replaced with electrically conductive layers, and the backside contact via trenches are then filled with another sacrificial material. The next stack is then formed over the underlying stack. When the top stack is formed over the underlying stacks, the steps shown in FIGS. 14A-26B are performed, and the memory stack structures 55, backside contact via structures 76 and control gate contact via structures 66 are formed through respective openings and trenches extending through all stacks (i.e., through three or more stacks).

Thus, in the embodiment method of the present disclosure, the electrically conductive control gate/word line materials are formed in each stack before the next stack is formed. Likewise, the steps, the memory openings, the support openings (if needed) and the backside contact trenches formed in each stack and filled with a sacrificial material before the net stack is formed. In contrast, the memory stack structures 55, backside contact via structures 76 (i.e., source electrode or local interconnect) and control gate contact via structures 66 (i.e., word line contact structures) are formed through respective openings and trenches extending through all stacks in a respective single step all of the stacks are formed and the sacrificial material layers are replaced with electrically conductive layers (i.e., control gate electrodes/word lines) in each stack.

The replacement of sacrificial material layers with electrically conductive layers in each stack allows many stacks to be formed in the device and to achieve a large number of device levels, since it is relatively difficult to obtain a high metal fill ratio when the horizontal sacrificial material layers are replaced with horizontal electrically conductive layers in a device with a large number of device levels. Likewise, since the formation of the steps and high aspect ratio openings in tall devices is relatively difficult, the steps and memory and support openings are formed in each stack before the next overlying stack is formed. In contrast, the vertical memory stack structures 55, backside contact via structures 76 and control gate contact via structures 66 can be formed in a single step in respective openings and trenches extending through all stacks to reduce the process cost.

The exemplary structure can include a monolithic three-dimensional memory device, which includes a lower stack structure (132, 146, 165) comprising a first alternating stack including first insulating layers 132 and first electrically conductive layers 146 and located over a substrate (9, 10), an upper stack structure (232, 246, 265, 70, 72) comprising a second alternating stack including second insulating layers 232 and second electrically conductive layers 246 and located over the lower stack structure (132, 146, 165), and a plurality of memory stack structures 55 extending through the lower stack structure (132, 146, 165) and the upper stack structure (232, 246, 265, 70, 72). Each of the memory stack structures 55 is located in a memory opening and comprises a lower blocking dielectric 21 contacting a sidewall of a lower portion of the memory opening, and an upper blocking dielectric 41 contacting a sidewall of an upper portion of the memory opening (i.e., an inter-stack memory opening) and as shown in the inset of FIG. 18, in one embodiment, the upper blocking dielectric 21 is not in physical contact with the lower blocking dielectric 21.

A bottom surface of the upper blocking dielectric 41 can be entirely within an area defined by an inner periphery of a top surface of the lower blocking dielectric 21. The sidewall of the lower portion of the memory opening is adjoined to the sidewall of the upper portion of the memory opening by a horizontal bottom surface of the second alternating stack (232, 246), which can be, for example, a bottom surface of a bottommost second insulator layer 232, as shown in the inset in FIG. 18. The lower blocking dielectric 21 and the upper blocking dielectric 41 are formed employing different processes. Thus, the upper blocking dielectric 41 and the lower blocking dielectric 21 can differ from each other by at least one of composition and thickness. In one embodiment, the sidewall of the lower portion of the memory opening and the sidewall of the upper portion of the memory opening can be tapered.

In one embodiment, each of the plurality of memory stack structures 55 can comprise a memory film 50 including a memory material layer 54 and a tunneling dielectric layer 56. In one embodiment, each memory material layer 54 can contact a horizontal surface of the upper stack structure (232, 246, 265, 70, 72), which can be, for example, a bottom surface of a bottommost second insulator layer 232. In one embodiment, the contact area between one of the memory material layers 54 and the horizontal surface of the upper stack structure (232, 246, 265, 70, 72) can have an annular shape, i.e., a substantially circular shape with a hole therein, as shown in the inset in FIG. 19.

The monolithic three-dimensional memory device can further include semiconductor channels including vertical portions 60 located within the memory stack structures 55 and a horizontal portion (i.e., a surface portion of the semiconductor material layer 10) adjoining a source region 61 located below the lower stack. An upper portion of each vertical portion of the semiconductor channels contacts a drain region 63. In one embodiment, at least one support pillar structure 55' can extend through stepped surfaces of the lower and upper stack structures, and can comprise the same set of materials as the plurality of memory stack structures 55'. In one embodiment, each of the at least one support pillar structure 55' can comprises a dummy semiconductor channel 60 having a same composition as, and a same thickness as, the semiconductor channels 60. The dummy semiconductor channel is not electrically connected to a driver circuit of the monolithic three-dimensional memory device.

In one embodiment, each second electrically conductive layer 246 that underlies at least another second electrically conductive layer 246 can laterally extend farther than any overlying layer among the second electrically conductive layers 246. Further, each first electrically conductive layer 146 that underlies at least another first electrically conductive layer 146 can laterally extend farther than any overlying layer among the first electrically conductive layers 146.

The control gate contact via structures 66 can be located within the contact region. The control gate contact via structures 66 can vertically extend at least through a dielectric material portion within the upper stack structure, i.e., the second retro-stepped dielectric material portion 265), and can contact a respective electrically conductive layer selected from the first and second electrically conductive layers (146, 246).

In one embodiment, the lower stack structure can further comprises a first dielectric material portion, e.g., the first retro-stepped dielectric material portion 165, located on, and over, first stepped surfaces of the first alternating stack (132, 146), and the upper stack structure can further comprises a second dielectric material portion, e.g., the second retro-stepped dielectric material portion 265, located on, and over, second stepped surfaces of the second alternating stack (232, 246). The first stepped surfaces and the second stepped surfaces can be located within a contact region, and a subset of control gate contact via structures 66 extends through the first dielectric material portion and the second dielectric material portion.

In one embodiment, the monolithic three-dimensional memory structure comprises a monolithic three-dimensional NAND memory device. The first and second electrically conductive layers can comprise, or can be electrically connected to, a respective word line of the monolithic three-dimensional NAND memory device. The substrate (9, 10) can comprise a silicon substrate. The monolithic three-dimensional NAND memory device can comprise an array of monolithic three-dimensional NAND strings over the silicon substrate. At least one memory cell in a first device level of the array of monolithic three-dimensional NAND strings can be located over another memory cell in a second device level of the array of monolithic three-dimensional NAND strings. The silicon substrate can contain an integrated circuit comprising a driver circuit for the memory device located thereon. The array of monolithic three-dimensional NAND strings can comprises a plurality of semiconductor channels. At least one end portion of each of the plurality of semiconductor channels extends substantially perpendicular to a top surface of the substrate. The array of monolithic three-dimensional NAND strings can comprises a plurality of charge storage elements. Each charge storage element can be located adjacent to a respective one of the plurality of semiconductor channels. The array of monolithic three-dimensional NAND strings can comprise a plurality of control gate electrodes having a strip shape extending substantially parallel to the top surface of the substrate. The plurality of control gate electrodes can comprise at least a first control gate electrode located in the first device level and a second control gate electrode located in the second device level.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device comprising:
   a lower stack structure comprising a first alternating stack including first insulating layers and first electrically conductive layers and located over a substrate;
   an upper stack structure comprising a second alternating stack including second insulating layers and second electrically conductive layers and located over the lower stack structure; and
   a plurality of memory stack structures extending through the lower stack structure and the upper stack structure; wherein:
   each of the memory stack structures is located in a memory opening and comprises a lower blocking dielectric physically contacting a sidewall of a lower portion of the memory opening and continuously extending from a bottommost first insulating layer in the first alternating stack to an interface between the lower stack structure and the upper stack structure, and an upper blocking dielectric contacting a sidewall of an upper portion of the memory opening and continuously extending from the interface between the lower stack structure and the upper stack structure to a topmost layer in the upper stack structure and not in physical contact with the lower blocking dielectric;
   the sidewall of the lower portion of the memory opening is adjoined to the sidewall of the upper portion of the memory opening by a horizontal bottom surface of the upper stack structure;
   each of the plurality of memory stack structures comprises a memory film including a memory material layer and a tunneling dielectric layer that extends through the first alternating stack and the second alternating stack as a single continuous material layer; and
   each memory material layer contacts the horizontal bottom surface of the upper stack structure.

2. The monolithic three-dimensional memory device of claim 1, wherein a bottom surface of the upper blocking dielectric is entirely within an area defined by an inner periphery of a top surface of the lower blocking dielectric.

3. The monolithic three-dimensional memory device of claim 1, wherein the upper blocking dielectric and the lower blocking dielectric differ from each other by at least one of composition and thickness.

4. The monolithic three-dimensional memory device of claim 1, wherein the sidewall of the lower portion of the memory opening and the sidewall of the upper portion of the memory opening are tapered.

5. The monolithic three-dimensional memory device of claim 1, wherein a contact area between the memory material layer and the horizontal surface of the upper stack structure has an annular shape.

6. The monolithic three-dimensional memory device of claim 1, further comprising semiconductor channels including vertical portions located within the memory stack structures and a horizontal portion adjoining a source region located below the lower stack, wherein an upper portion of each vertical portion of the semiconductor channels contacts a drain region.

7. The monolithic three-dimensional memory device of claim 6, further comprising at least one support pillar structure extending through stepped surfaces of the lower and upper stack structures, and comprising a same set of materials as the plurality of memory stack structures.

8. The monolithic three-dimensional memory device of claim 7, wherein:
   each of the at least one support pillar structure comprises a dummy semiconductor channel having a same composition as, and a same thickness as, the semiconductor channels; and the dummy semiconductor channel is not electrically connected to a driver circuit of the monolithic three-dimensional memory device.

9. The monolithic three-dimensional memory device of claim 1, wherein:
   each second electrically conductive layer that underlies at least another second electrically conductive layer laterally extends farther than any overlying layer among the second electrically conductive layers; and
   each first electrically conductive layer that underlies at least another first electrically conductive layer laterally extends farther than any overlying layer among the first electrically conductive layers.

10. The monolithic three-dimensional memory device of claim 9, further comprising control gate contact via structures located within the contact region, vertically extending at least through a dielectric material portion within the upper stack structure, and contacting a respective electrically conductive layer selected from the first and second electrically conductive layers.

11. The monolithic three-dimensional memory device of claim 1, wherein:
   the lower stack structure further comprises a first dielectric material portion located on, and over, first stepped surfaces of the first alternating stack;
   the upper stack structure further comprises a second dielectric material portion located on, and over, second stepped surfaces of the second alternating stack;
   the first stepped surfaces and the second stepped surfaces are located within a contact region; and
   a subset of control gate contact via structures extends through the first dielectric material portion and the second dielectric material portion.

12. The monolithic three-dimensional memory device of claim 1, wherein:
   the monolithic three-dimensional memory structure comprises a monolithic three-dimensional NAND memory device;
   the first and second electrically conductive layers comprise, or are electrically connected to, a respective word line of the monolithic three-dimensional NAND memory device;
   the substrate comprises a silicon substrate;
   the monolithic three-dimensional NAND memory device comprises an array of monolithic three-dimensional NAND strings over the silicon substrate;
   at least one memory cell in a first device level of the array of monolithic three-dimensional NAND strings is located over another memory cell in a second device level of the array of monolithic three-dimensional NAND strings;
   the silicon substrate contains an integrated circuit comprising a driver circuit for the memory device located thereon; and
   the array of monolithic three-dimensional NAND strings comprises:
   a plurality of semiconductor channels, wherein at least one end portion of each of the plurality of semiconductor channels extends substantially perpendicular to a top surface of the substrate;
   a plurality of charge storage elements, each charge storage element located adjacent to a respective one of the plurality of semiconductor channels; and
   a plurality of control gate electrodes having a strip shape extending substantially parallel to the top surface of the substrate, the plurality of control gate electrodes comprise at least a first control gate electrode located in the first device level and a second control gate electrode located in the second device level.

13. The monolithic three-dimensional memory device of claim 1, wherein a top periphery of the sidewall of the lower portion of the memory opening and a bottom periphery of the sidewall of the upper portion of the memory opening are located within a horizontal plane including the interface between the lower stack structure and the upper stack structure.

14. The monolithic three-dimensional memory device of claim 13, wherein the top periphery of the sidewall of the lower portion of the memory opening is located outside of, and laterally surrounds, the bottom periphery of the sidewall of the upper portion of the memory opening.

15. The monolithic three-dimensional memory device of claim 14, wherein the top periphery of the sidewall of the lower portion of the memory opening is adjoined to the bottom periphery of the sidewall of the upper portion of the memory opening by the horizontal bottom surface of the upper stack structure.

16. The monolithic three-dimensional memory device of claim 15, wherein the horizontal bottom surface of the upper stack structure is located within the horizontal plane including the interface between the lower stack structure and the upper stack structure.

17. The monolithic three-dimensional memory device of claim 16, wherein a horizontal surface of the memory material layer physically contacts the horizontal bottom surface of the upper stack structure.

* * * * *